(12) United States Patent
Suzuki

(10) Patent No.: US 9,070,463 B2
(45) Date of Patent: Jun. 30, 2015

(54) FLASH MEMORY MODULE FOR REALIZING HIGH RELIABILITY

(71) Applicant: Hitachi, Ltd., Tokyo (JP)

(72) Inventor: Akifumi Suzuki, Nakai (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/560,313

(22) Filed: Dec. 4, 2014

(65) Prior Publication Data

US 2015/0085577 A1    Mar. 26, 2015

Related U.S. Application Data

(63) Continuation of application No. 14/221,720, filed on Mar. 21, 2014, now Pat. No. 8,929,143, which is a continuation of application No. 13/256,153, filed as application No. PCT/JP2011/004787 on Aug. 29, 2011, now Pat. No. 8,681,554.

(51) Int. Cl.
*G11C 16/04* (2006.01)
*G11C 16/16* (2006.01)

(52) U.S. Cl.
CPC .................................. *G11C 16/16* (2013.01)

(58) Field of Classification Search
CPC ... G11C 16/16; G11C 11/5621; G11C 29/021
USPC .............. 365/185.16, 185.29, 230.03, 230.06
See application file for complete search history.

(56) References Cited

U.S. PATENT DOCUMENTS

| | | | |
|---|---|---|---|
| 6,587,382 B1 | 7/2003 | Estakhri et al. | |
| 7,441,067 B2 | 10/2008 | Gorobets et al. | |
| 8,050,086 B2 * | 11/2011 | Shalvi et al. | 365/185.02 |
| 8,050,095 B2 | 11/2011 | Gonzalez et al. | |
| 8,199,586 B2 | 6/2012 | Lutze et al. | |
| 2006/0062048 A1 | 3/2006 | Gonzalez et al. | |
| 2008/0181018 A1 | 7/2008 | Nagadomi et al. | |
| 2008/0285351 A1 | 11/2008 | Shlick et al. | |
| 2009/0135646 A1 | 5/2009 | Murin et al. | |
| 2009/0144489 A1 | 6/2009 | Watanabe et al. | |
| 2009/0216938 A1 | 8/2009 | Conley et al. | |
| 2010/0165689 A1 | 7/2010 | Rotbard et al. | |
| 2011/0219177 A1 | 9/2011 | Kanno et al. | |
| 2012/0206967 A1 | 8/2012 | Lutze et al. | |
| 2013/0007343 A1 | 1/2013 | Rub et al. | |
| 2014/0185376 A1 * | 7/2014 | Sinclair et al. ........... 365/185.03 |

FOREIGN PATENT DOCUMENTS

| | | |
|---|---|---|
| EP | 2077559 A2 | 7/2009 |
| JP | 2009-265912 A | 11/2009 |
| JP | 2010-27021 A | 2/2010 |

OTHER PUBLICATIONS

Japanese Office Action with English concise explanation, Japanese Patent Appln. No. 2014-505787, Jul. 8, 2014, 6 pp.

* cited by examiner

*Primary Examiner* — Tuan T Nguyen

(74) *Attorney, Agent, or Firm* — Volpe and Koenig, P.C.

(57) ABSTRACT

A flash memory module may include a plurality of flash memory chips. The memory chips may include one or more blocks. Each block may be a unit of erasing data. A flash controller may be coupled to the plurality of flash memory chips. The flash controller may program data to block and erase data from a block. The flash controller may manage a recent programming time for each of the plurality of blocks. The flash controller may erase data stored in a block for which an elapsed programming time is larger than a first value.

12 Claims, 21 Drawing Sheets

Fig. 6

| PBA Group | Chip number | Block number | Number of erases | Previous erase date/time | First page programming date/time | Last page programming date/time | Last page programmed | Number of invalid pages |
|---|---|---|---|---|---|---|---|---|
| 0x0000000000 | 0 | 0 | 1240 | 2011/01/05 15:00 | 2011/01/06 9:00 | 2011/01/23 15:00 | 127 | 121 |
| 0x0000100000 | 0 | 1 | 1245 | 2011/01/01 18:00 | No write | Incomplete | No write | 1 |
| 0x0000200000 | 0 | 2 | 1202 | 2011/04/04 9:00 | 2011/04/04 10:05 | 2011/04/07 15:00 | 127 | 13 |
| 0x0000300000 | 0 | 3 | 1290 | 2011/03/25 6:00 | 2011/04/05 9:00 | Incomplete | 56 | 56 |
| ...... | ...... | ...... | ...... | ...... | ...... | ...... | ...... | ...... |
| 0xFFFFE00000 | 255 | 4094 | 1243 | 2011/03/15 2:00 | 2011/04/05 11:00 | Incomplete | 96 | 2 |
| 0xFFFFF00000 | 255 | 4095 | 1230 | 2011/02/15 23:00 | 2011/02/16 15:00 | 2011/02/24 15:00 | 127 | 127 |

Fig. 7

| Range of erases | PBA Group | | |
|---|---|---|---|
| Average value − 201 or lower | 0xF0FFE00000 | 0xF24AE00000 | ...... 0x5912400000 |
| From average value − 201 to average value − 101 | 0x234FA00000 | 0x01A4200000 | ...... 0x038E00000 |
| From average value − 100 to average value + 99 | 0x00F2E00000 | 0xB23E00000 | ...... 0x8023A00000 |
| From average value + 100 to average value + 199 | 0x034E00000 | 0x3A2E00000 | ...... 0x0D23400000 |
| Average value + 200 or higher | 0x51400000 | 0x0396000000 | ...... 0x0003000000 |

Fig. 15

| Elapsed programming time | PBA Group | | | |
|---|---|---|---|---|
| 30 minutes or more | 0x10FFE00000 | 0x124AE00000 | ........ | 0x5912400000 |
| From 20 minutes to 29 minutes | 0x7743E00000 | 0x2924000000 | ........ | 0x038E00000 |
| From 10 minutes to 19 minutes | 0x030E00000 | 0x3A0E00000 | ........ | 0x8023A00000 |
| Less than 10 minutes | 0x504000000 | 0x039600000 | ........ | 0x0003000000 |

| Number of elapsed days | Failed bit threshold |
|---|---|
| 0 | 8 |
| 1 | 9 |
| 2 | 10 |
| 3 | 11 |
| ⋮ | ⋮ |
| 11 | 21 |
| 12 | 22 |

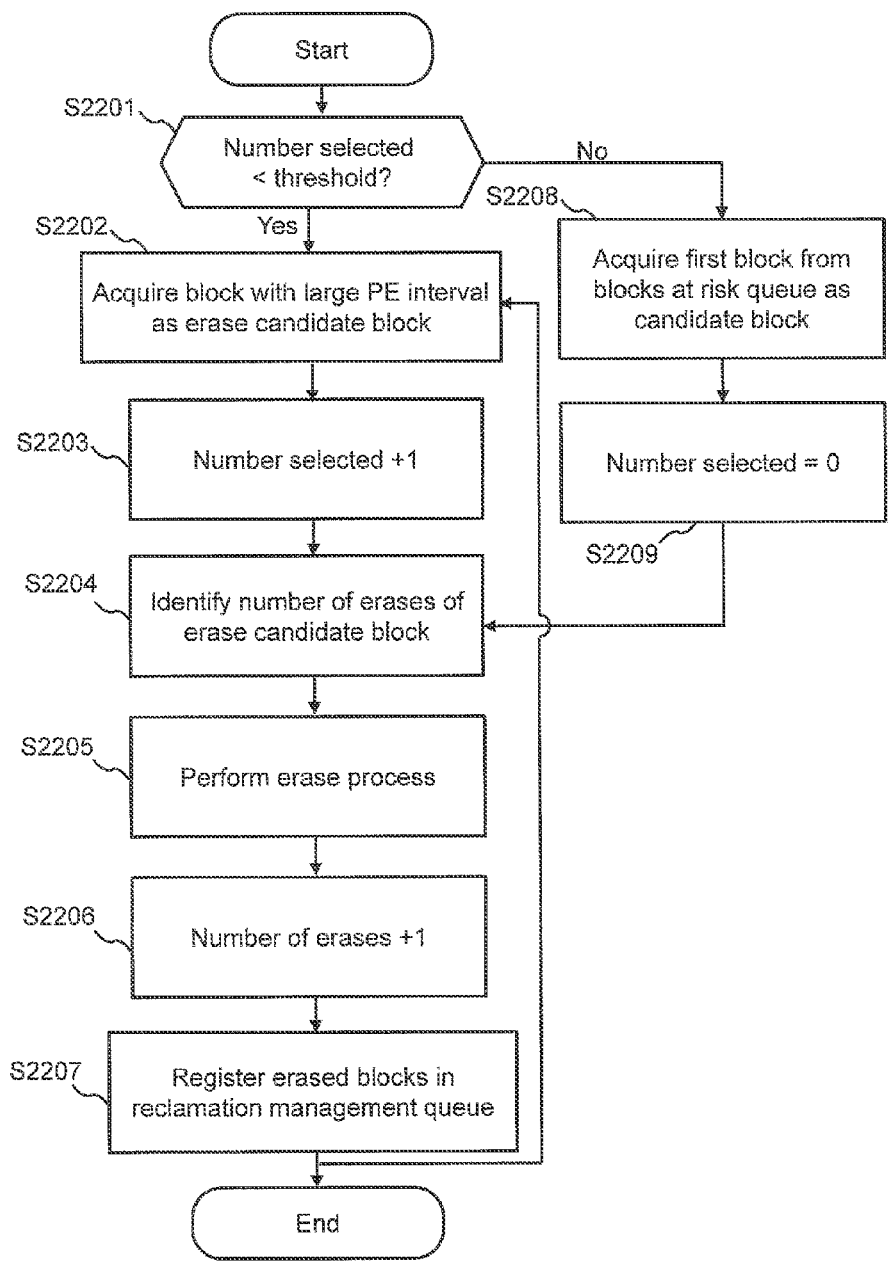

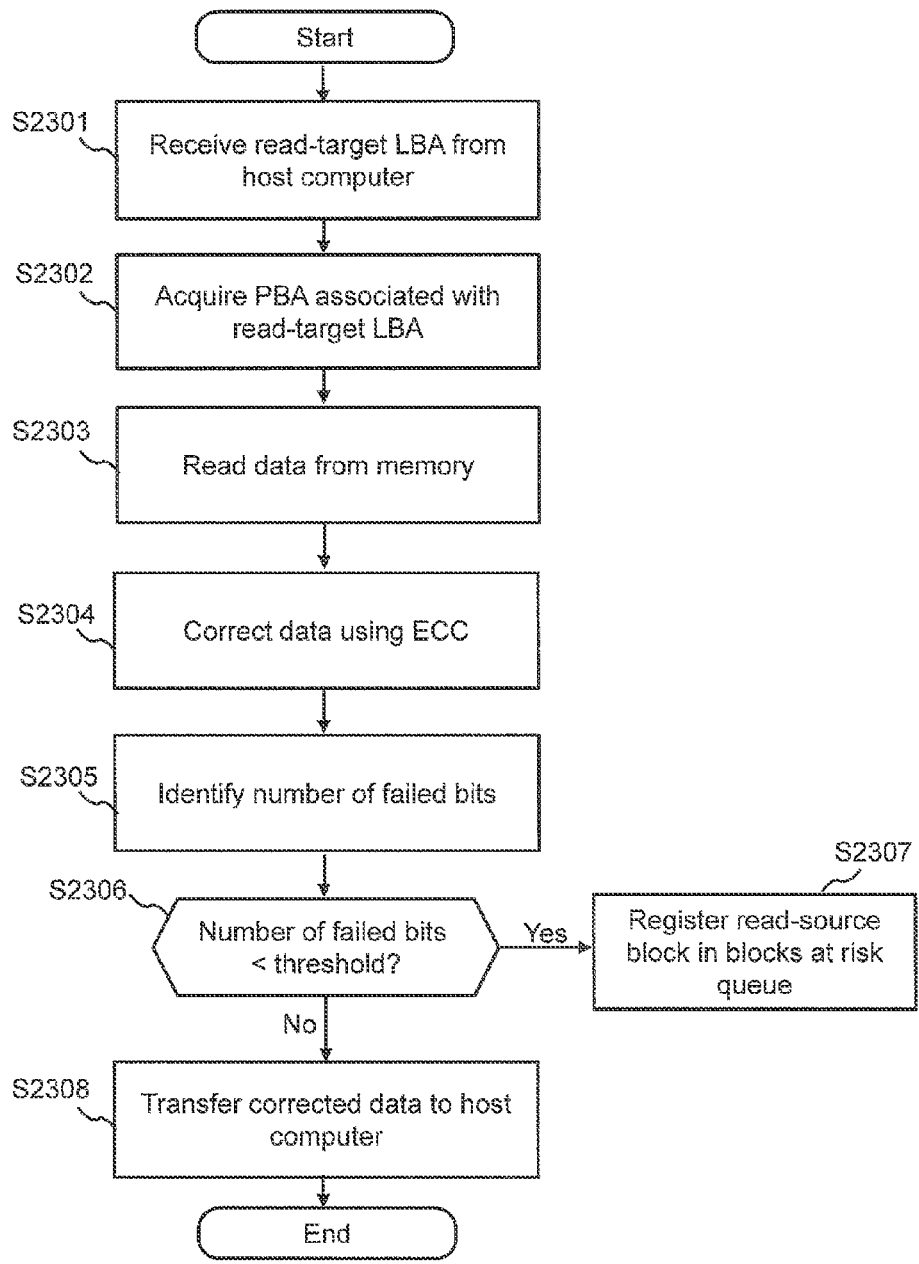

FLASH MEMORY MODULE FOR REALIZING HIGH RELIABILITY

TECHNICAL FIELD

The present invention relates to storage control for programming data to an electrically rewritable nonvolatile semiconductor memory.

BACKGROUND ART

In a nonvolatile semiconductor memory, an electron is sent through an oxide insulation layer to a floating gate in a process for storing (programming) data to an internal cell. Furthermore, an electron is removed from the FG (Floating Gate) through the oxide insulation layer in a process for erasing (erase) the stored data.

A nonvolatile semiconductor memory comprising this kind of data storage mechanism puts a load on the oxide insulation layer at each programming and erase process. Repeating this load creates multiple electron traps and positive hole traps inside the oxide insulation layer.

The nonvolatile semiconductor memory measures a threshold voltage, which fluctuates in accordance with the charge (number of electrons) inside the FG, to determine the recorded data. For this reason, when electron traps and positive hole traps are formed inside the oxide insulation layer as mentioned hereinabove, the electrons in these electron traps and positive hole traps give rise to residual voltage, and this voltage causes the FG threshold voltage to fluctuate, making it impossible to accurately determine the recorded data.

The threshold voltage fluctuations resulting from electron traps and positive hole traps like these are known to be a function of the control interval and the cumulative number of times that programming and erasing are executed. Furthermore, changes in the data storage time characteristics (hereinafter, referred to as retention characteristics) in accordance with the fluctuation of the threshold voltage is also known.

Since a charge that has accumulated in the FG will change in accordance with the passage of time, the data storage period of a nonvolatile semiconductor memory is limited. In addition, the data storage period is further shortened by the fluctuation of the threshold voltage resulting from the above-mentioned electron traps and positive hole traps.

A semiconductor storage apparatus that uses a nonvolatile semiconductor memory as the storage medium (hereinafter, referred to as the storage apparatus) must satisfy the data storage period criteria stipulated in the apparatus specifications. The storage apparatus predicts the deterioration of the oxide insulation layer based on the number of times that data is programmed and erased, and in a case where it is predicted that the data storage period of a specific area of onboard nonvolatile semiconductor memory will not meet the criteria, makes this storage area unusable.

To ensure that operation can continue even when an unusable area such as this has occurred, the storage apparatus is generally equipped with spare storage areas in excess of the total amount of stored data of the apparatus, and exercises control such that this spare storage area is allocated in place of the above-mentioned area that has been determined to be unusable so as to constantly maintain a fixed storage area. However, when this allocated spare area is exhausted, the storage apparatus loses its ability to record new data and shuts down.

Therefore, to realize a long-life storage apparatus, it is necessary to hold the fluctuation of the threshold voltage in accordance with the electron traps and positive hole traps in check, and to prevent the data storage period of a storage area from being shortened.

For example, Patent Literature 1 discloses control for lessening the effects of these electron traps and positive hole traps. In the Patent Literature 1, there is disclosed a storage apparatus, which makes an area whose retention characteristics have worsened unusable for a fixed period, reduces the electron traps and position hole traps, and reuses the storage area (Patent Literature 1).

CITATION LIST

Patent Literature

[PTL 1] US Patent Application No. 2010/0165689 A1

SUMMARY OF INVENTION

Technical Problem

For example, a nonvolatile semiconductor memory (typically a flash memory) is configured from multiple blocks, and this block is the smallest erase unit. Then, as described hereinabove, because electron traps and positive hole traps are formed in the oxide insulation layer in accordance with repeated erasing and programming, an upper limit is provided on the number of erases for each block.

Generally speaking, the semiconductor memory is not capable of overwriting, and a programmed area must be erased before this area can be used for programming once again. Therefore, erasing and programming are always carried out as a set when programming new data to a block in which data is programmed. For this reason, the storage apparatus manages the number of times that erasing has been carried out for a block (hereinafter, referred to as number of block erases) by block, treats a block, which has exceeded the upper limit for number of block erases, as having exceeded the data storage period (specifically, the period of time that data can be held and stored reliably), designates this block as being unusable, and allocates a spare block as a substitute.

In a case where erasing and programming have concentrated on a specific group of blocks, there is the likelihood of generating large numbers of blocks for which the number of block erases reaches the upper limit in a short period of time, rendering the blocks unusable. Then, since spare blocks must be allocated to these blocks, the spare blocks will be rapidly exhausted. That is, concentrating access on a specific block group speeds up the exhaustion of spare blocks, shortening the life of the storage apparatus.

The storage apparatus disperses block programming processes to prevent access and programming from concentrating on a specific block group like this, and carries out a process for equalizing the number of erases per block (hereinafter, this processing will be referred to as wear leveling). Wear leveling is a process for preferentially programming data to a block with a lower number of erases than an average value of the number of erases of blocks mounted in the storage apparatus.

For this reason, in a case where there is a block (hereinafter, will be referred to as the target block) for which the average value of the number of block erases of the blocks in the storage apparatus is X (where X is an integer equal to or larger than 1), and the number of block erases within a block in the storage apparatus is Y (where Y is an integer that satisfies the condition Y<X), this target block will be used preferentially.

For this reason, programming and erasing are likely to be repeated in a short period of time with respect to this target block.

In general, the data storage period increases the shorter the time between erasing a block and programming data to this block (hereinafter, will be referred to as the EP interval).

For this reason, even though the number of block erases of a certain block is small, the repeated preferential use of this block shortens the time from programming to erasing with respect to this block (hereinafter, will be referred to as the PE interval). As a result, there is the likelihood of large numbers of blocks for which the data storage period has elapsed being generated in a short period of time even though the number of block erases of this block has not reached the upper limit value. In accordance with this, there is an increased likelihood of the life of this storage apparatus being shortened.

That is, there are cases in which it will be impossible to maintain the reliability of the storage apparatus simply by counting the number of block erases and performing wear leveling.

Therefore, an object of the present invention is to realize high reliability and long life in a semiconductor storage apparatus that uses nonvolatile semiconductor memory as the storage medium.

Solution to Problem

A semiconductor storage apparatus stores management information comprising, for each block of a nonvolatile semiconductor memory, information denoting at least one of a recent programming time, which is a time at which data is recently programmed to a block, and a recent erase time, which is a time at which an erase process is recently performed with respect to a block. The semiconductor storage apparatus (b1) controls a timing at which data is programmed to a block based on at least one of the recent programming time or the recent erase time of this block, and/or (b2) controls a timing at which an erase process is performed with respect to a block based on the recent programming time of this block.

For example, the semiconductor storage apparatus may control the time interval of each programming and erase process, which are normal processes of the semiconductor storage apparatus, while carrying out the equalization of the number of erases using wear leveling to ensure a minimal time.

Furthermore, for example, the semiconductor storage apparatus may exercise control so as to ensure the time intervals of programming and an erase process with respect to each block for as long as possible relative to a request from a higher-level apparatus (for example, a host computer).

Also, for example, when a block with poor data retention characteristics is detected, the semiconductor storage apparatus may implement control so as to lower the utilization frequency of this block. A reduction in electron traps and positive hole traps can be expected in accordance with this, and therefore retention characteristics can be expected to recover.

Advantageous Effects of Invention

According to the present invention, it is possible to heighten the reliability and extend the service life of a semiconductor storage apparatus.

BRIEF DESCRIPTION OF DRAWINGS

FIG. 6 shows an example of a block management table 600.

FIG. 7 shows an example of a wear leveling management queue 700.

FIG. 15 shows an example of a PE interval management queue 1500.

FIG. 22 shows an example of the flow of erase processing in Example 3.

FIG. 23 shows an example of the flow of read processing in Example 3.

DESCRIPTION OF EMBODIMENTS

A number of examples of the present invention will be explained below.

Furthermore, in the following explanation, various types of information may be explained using the expression "xxx table", but the various information may also be expressed using a data structure other than a table. To show that the various information is not dependent on the data structure, "xxx table" can be called "xxx information".

Furthermore, in the following explanation, a number is used as identification information for identifying an element, but another type of identification information (for example, alphanumeric characters) may be used either instead of or in addition to a number as the identification information.

Also, in the following explanation, there may be cases where processing is explained having a "program" as the doer of the action, but since the stipulated processing is performed in accordance with a program being executed by a processor (for example, a CPU (Central Processing Unit)) while using a storage resource (for example, a memory) and/or a communication interface device (for example, a communication port) as needed, the processor may also be used as the doer of the processing. A process, which is explained using the program as the doer of the action, may be regarded as a process performed by an apparatus comprising this processor (for example, a storage control apparatus or a storage apparatus). Furthermore, the processor may comprise a hardware circuit that carries out either part or all of the processing either instead of or in addition to a microprocessor like the CPU. A computer program may be installed in respective apparatuses from a program source. The program source, for example, may be either a program delivery server or a computer readable storage medium.

Furthermore, the management computer may be configured using one or more computers. For example, in a case where either the management computer displays information or the management computer sends display information to a remote computer, a single computer is the management computer. Also, for example, in a case where the same functions as those of the management computer are realized using multiple computers, the relevant multiple computers (may include a display computer in a case where a display is made by the display computer) are the management computer.

Furthermore, in the following explanation, in a case where an explanation is given without making a distinction between elements of the same type, only the sign that is common to both elements within the reference sign will be used, and in a case where an explanation is given by making a distinction between elements of the same type, the reference sign (a combination of the common sign and a specific sign) will be used.

EXAMPLE 1

Figure 1:
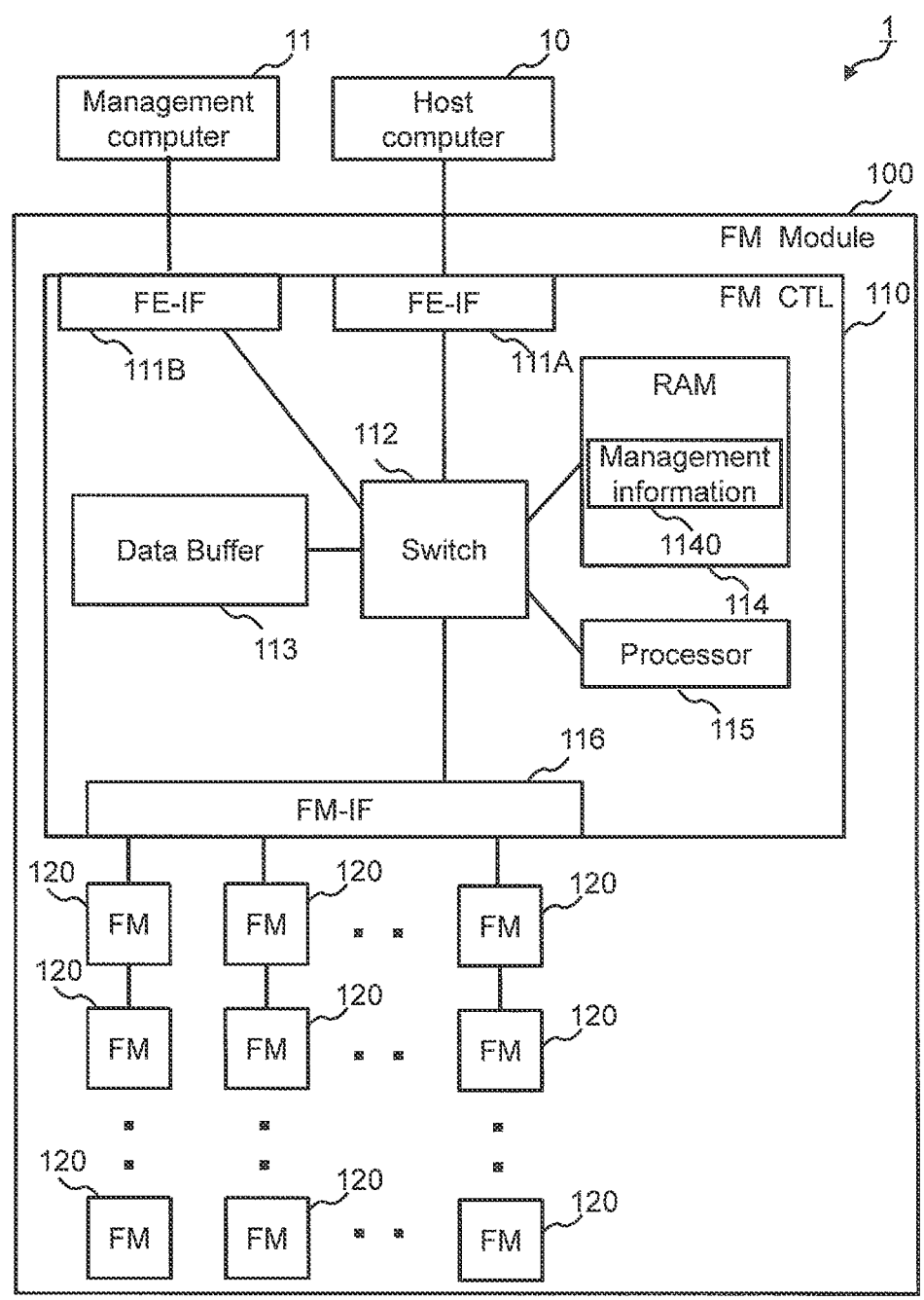
FIG. 1 shows an example of the configuration of a computer system 1 comprising an FM module 100 related to Example 1.

FIG. 1 shows an example of the configuration of a computer system 1 comprising a semiconductor storage apparatus 100 related to Example 1 of the present invention. Furthermore, because a semiconductor memory is typically a FM (Flash Memory), the semiconductor storage apparatus will be called a "FM module" hereinbelow.

The computer system 1 comprises a host computer 10, a management computer 11, and a semiconductor storage apparatus (will be called the FM (Flash Memory) module hereinbelow) 100.

The FM module 100 is coupled to the host computer 10 via a built-in first FE-IF (Front End-Interface) 111, and is coupled to the management computer 11 via a built-in second FE-IF 111. The communication protocol between the FM module 100 and the host computer 10 and the communication protocol between the FM module 100 and the management computer 11 may either be the same protocol or a different protocol.

The host computer 10, for example, is a computer, a file server, or a storage apparatus to which large numbers of FM modules 100 are coupled, which serves as the core of a business system.

The host computer 10, for example, comprises hardware resources, such as a not-shown processor, memory, network interface, and local input/output device. Furthermore, the host computer 10 comprises software resources, such as a device driver, an OS (Operating System), a management program, and an application program.

The processor of the host computer 10 can execute the various programs (software resources). For example, by the processor of the host computer 10 executing an application program, the host computer 10 is able to communicate with the FM module 100 and issue a data read/write command to the FM module 100. Furthermore, for example, by the host computer 10 processor executing a management program, the host computer 10 is able to acquire management information, such as the utilization status and processing status of the FM module 100. Furthermore, the host computer 10 can specify the management unit and the control method of the FM module 100, and can change the control method.

The management computer 11 can manage the entire computer system 1. The management computer 11, for example, comprises a not-shown input device, such as a keyboard or mouse, a processor, a display device, such as a liquid crystal display device, and a storage resource, such as a memory. Various programs are stored in this storage resource, and these programs are executed by the processor to realize various functions.

The FM module 100 comprises a FM controller 110, and multiple (for example, 32) nonvolatile semiconductor memory (hereinafter, simply called memory) 120. Multiple RAID groups may be configured based on the multiple memory chips 120. A RAID group may be configured using two or more memory chips 120. A logical volume may be configured based on a RAID group. The logical volume may be provided to the host computer 10, or may be a type of logical volume (for example, a pool volume, which is a logical volume that makes up a pool) that is not provided to the host computer 10. The pool volume may be partitioned into two or more areas (hereinafter, actual areas). An actual area may be allocated to a virtual area, which makes up a virtual logical volume conforming to Thin Provisioning. At least one of the multiple pool volumes making up the pool may be a virtual logical volume to which is mapped a logical volume of an external storage apparatus (not shown in the drawing) coupled to the FM module 100.

The FM controller 110, in this example, is a controller that is built into the FM module 100, but may also be a computer, which exists outside of the FM module 100. The FM controller 110 comprises a FE-IF (Front End-Interface) 111, a switch 112 for transferring data back and forth, a storage resource (for example, a data buffer 113, and a RAM (Random Access Memory) 114), a processor 115, and a FM-IF (Flash Memory-Interface) 116.

The switch 112 is coupled to the processor 115, the RAM 114, the data buffer 113, the FE-IF 111 and the FM-IF 116, and transfers and routes data in accordance with either an address or an ID.

The FE-IF 111 is coupled to various components of the FM controller 110, the host computer 10 and the management computer 11 via the switch 112. The FE-IF 111 receives a read/write command and a LBA (Logical Block Address), which specifies a target logical storage location, from the host computer 10. Upon receiving a write command from the host computer 10, the FE-IF 111 also receives write data from the host computer 10. Furthermore, the FE-IF 111 receives a control command and the like for the FM module 100 from the host computer 10 and the management computer 11, and controls the FM module 100 in accordance with this command. The FE-IF 111 also notifies the host computer 10 and the management computer 11 of the processing status, the utilization status and the current setting values of the FM module 100.

The data buffer 113 stores temporary data that is in the midst of a data transfer process in accordance with the FM controller 110.

The RAM 114, specifically, is a volatile memory, such as a DRAM (Dynamic Random Access Memory). The RAM 114 stores the memory chip 120 management information 1140, which is used by the FM module 100, and a transfer list, which includes transfer control information used by each DMA (Direct Memory Access). Furthermore, the RAM 114 includes either a portion or all of the functions of the data buffer 113 for storing data, and can also be used as a temporary storage destination for data.

The processor 115 is coupled to the respective components of the FM controller 110 via the switch 112, and controls the entire FM controller 110 based on the programs and management information stored in the RAM 114. Furthermore, the processor 115 monitors the entire FM controller 110 by regularly acquiring information and an interrupt reception function.

The FM-IF 116 is coupled to the memory chip 120 via multiple buses (for example, 16). Multiple memory chips 120 (for example, two) are coupled to each bus. Each memory chip coupled to each bus is independently controlled on the basis of a CE (Chip Enable) signal.

The FM-IF 116 performs processing in accordance with a read/write command specified from the processor 115. At this time, the FM-IF 116 is instructed as to the command target in accordance with a physical address (hereinafter, PBA (Physical Block Address)).

Upon receiving a PBA, the FM-IF 116 computes the required memory chip 120 (blocks, pages) based on this PBA, and processes the read/write command by specifying a block and a page in the memory chip 120.

At read processing, the FM-IF 116 reads the data from the memory chip 120 and transfers this data to the data buffer 113. Furthermore, at write processing, the FM-IF 116 calls the write data from the data buffer 113, and writes this data to the memory chip 120.

Furthermore, the FM-IF 116 comprises an ECC (Error Correcting Code) creation circuit, an ECC-based data loss detection circuit, and an ECC correction circuit. At write processing, the FM-IF 116 adds the ECC to the data and carries out the write. Furthermore, at the time of a data call, the FM-IF 116 checks the called data from the memory chip 120 by the ECC-based data loss detection circuit. When data loss is detected, the FM-IF 116 performs data correction in accordance with the ECC correction circuit, and in order to notify the processor 115 of the number of correction bits, stores the number of correction bits in the RAM 114.

The above-described FE-IF 111, switch 112, data buffer 113, RAM 114, processor 115, and FM-IF 116 may be configured inside a single semiconductor device as an ASIC (Application Specific Integrated Circuit) or FPGA (Field Programmable Gate Array), or the configuration may be such that multiple individual ICs (Integrated Circuits) are coupled to one another.

Figure 2:
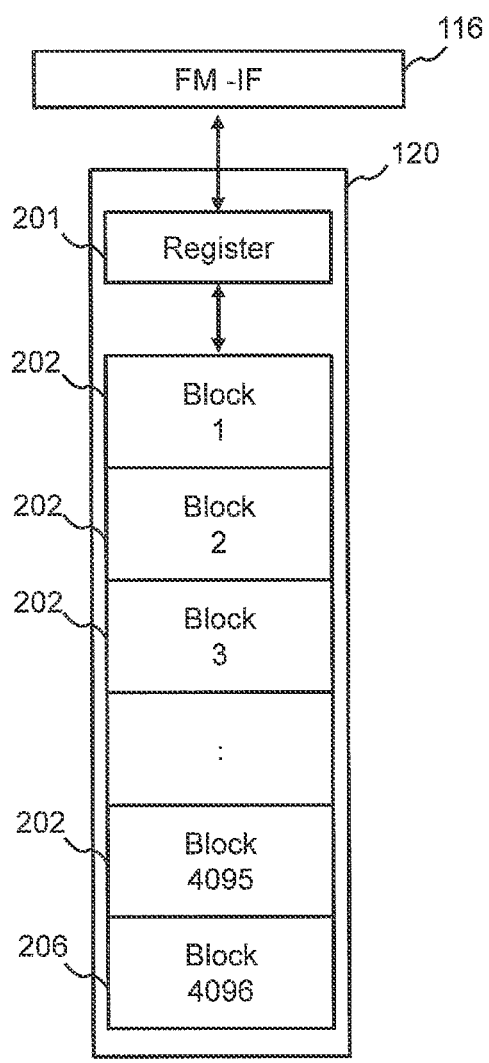
FIG. 2 shows an example of the configuration of a memory chip 120.

FIG. 2 shows an example of the configuration of the memory chip 120.

The memory chip 120 is configured from multiple (for example, 4,096) blocks 202. Each block 202 is configured using multiple pages. In the memory chip 120, erase processing is performed in units of blocks, and data read/programming are performed in units of pages. The memory chip 120, for example, is a NAND flash memory, which is capable of erasing data in block units. The flash memory does not have to be the NAND type (for example, a NOR type can also be used).

The memory chip 120 comprises a register 201. The register 201 has a storage capacity of equal to or larger than page size (for example, 4 KB+a spare area for adding an ECC).

The memory chip 120 performs processing in accordance with the instructions of a read-write command from the FM-IF 116.

In a write process, the memory chip 120 first receives a write command and write-destination information (for example, information denoting the write command target block, page number, and in-page program start location) from the FM-IF 116.

Next, the memory chip 120 stores the write data transferred from the FM-IF 116 in the register 201 in order from the in-page program start location (address). Thereafter, the register 201, upon receiving a data-transfer-complete command from the FM-IF 116, writes (programs) the data stored in the register 201 to the specified memory chip 120 (page).

In a read process, the memory chip 120 first receives a read command and read-source information (for example, a read command target block, and a page number) from the FM-IF 116. Next, the memory chip 120 reads the data stored in the page of the specified block 202, and stores this data in the register 201. Thereafter, the register 201 transfers the data stored in the register 201 to the FM-IF 116.

Figure 3:
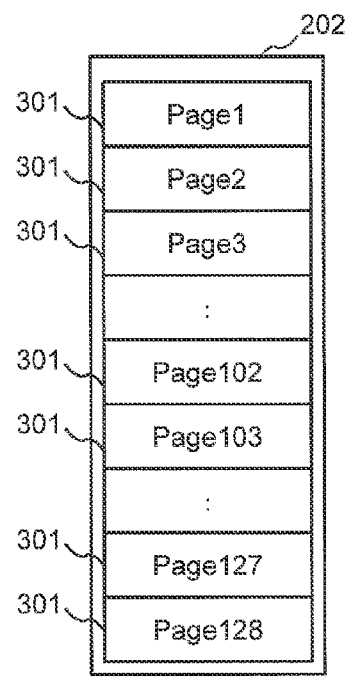
FIG. 3 shows an example of the internal configuration of a block 202.

FIG. 3 shows an example of the internal configuration of a block 202.

The block 202 is divided into multiple (for example, 128) pages 301, and a data read and a data write can only be processed in page units. Furthermore, the order for writing to a page 301 inside the block 202 is established, and in the drawing, data is sequentially written in order from page 1.

Figure 5:
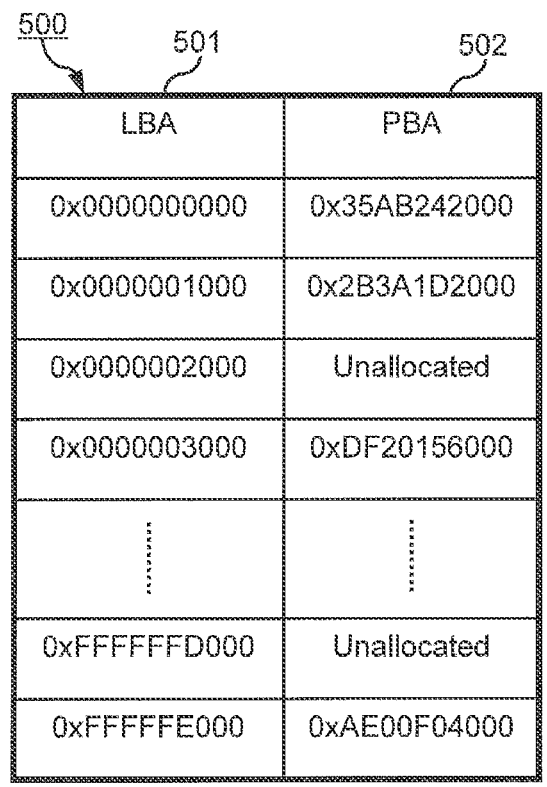
FIG. 5 shows an example of an address conversion table 500.

In the FM module 100, the host computer 10-specified LBA and the address PBA (Physical Block Address), which specifies a physical storage location inside the FM module 100, are managed in accordance with different address systems, and the corresponding relationship between the LBA and the PBA is managed as table information (refer to FIG. 5).

In the FM module 100, it is not possible to overwrite a page to which a write has been completed, and this page cannot be written to again until an erase process has been carried out with respect to the block to which this page belongs. Therefore, when updating data, the page associated with the LBA is changed to a new page prior to updating, and data is written to this new page. The host computer 10 does not know that a new page has been associated with the LBA like this. Furthermore, the page associated with the LBA becomes an invalid page prior to updating.

Furthermore, the PBA is an address system, which can uniquely specify an arbitrary page of the FM module 100, and arranges addresses consecutively in page number order within a range that is at least one block worth of data size. For example, when one page worth of data size is incremented with respect to a PBA specifying a third page in a certain block, the PBA transitions to a fourth page.

Figure 4:
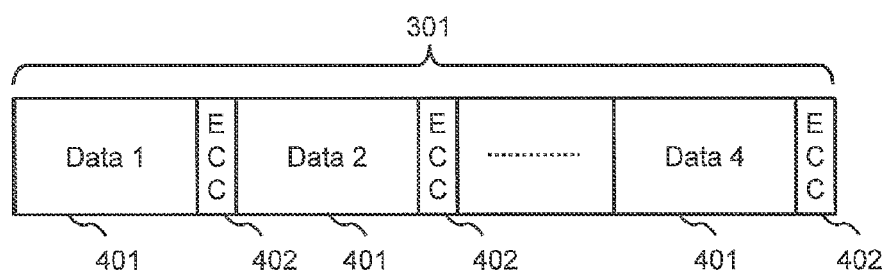
FIG. 4 shows an example of data stored in a page 301.

FIG. 4 shows an example of data stored in a page 301.

The page 301 stores a fixed number of bits (for example, 4 KB) of data. In addition to data 401, an ECC (Error Correcting Code) 402, which was appended by the FM-IF 116, is also stored in the page 301. The ECC is stored adjacent to the data 401 to be protected (hereinafter, will be called the protected data). The data 1 401 and the ECC 402 added to the data 1 401 are stored as a set so as to configure an ECC CW (ECC CodeWord).

Furthermore, a configuration in which four ECC CWs are stored in one page is shown in FIG. 4, but the number of ECC CWs can be an arbitrary number in accordance with the page size and the performance of the ECC (the number of correctable bits). Furthermore, a data loss failure in the above-described configuration is a phenomenon that occurs when the number of failed bits per single ECC CW exceeds the number of correctable bits of the ECC that makes up this ECC CW.

The configuration of the FM module 100 and the storage configuration of the data of the FM module 100 have been explained hereinabove.

FIG. 5 shows an example of an address conversion table 500.

The address conversion table 500 is one of the pieces of management information 1140 stored in the RAM 114 of the FM module 100.

The address conversion table 500 correspondingly manages a LBA 501 and a PBA 502 for each page (4 KB in the example of FIG. 5).

The LBA 501 denotes the first address of data stored in a single page. The PBA 502 denotes the address, which uniquely identifies a page configuring the memory chip 120. Furthermore, in a case where a PBA 502 has not been associated with an LBA 501, information denoting unallocated is stored in the LBA 501.

In this example, each time new data is written to a page corresponding to an LBA 501, the FM controller 110 associates a new PBA 503 in place of the LBA 501 associated with this LBA 501. The FM controller 110 associates a new PBA 502 with the LBA 501 specified from the host computer 10, and registers this association in the address conversion table 500. Furthermore, in FIG. 5, an example in which the LBA 501 and the PBA 502 have been associated in units of page size is shown, but the present invention is not limited to this unit. For example, the LBA 501 and the PBA 502 can also be associated in units of block size.

Next, management information for carrying out the time control, which is a characteristic feature of this example, will be explained.

FIG. 6 shows an example of a block management table 600.

The block management table 600 is one of the pieces of management information stored in the RAM 114 of the FM module 100.

The block management table 600 correspondingly manages for each block (1 MB in the example of FIG. 6) 202 a PBA group 601, a chip number 602, a block number 603, the number of erases 604, a previous erase date/time 605, a first page programming date/time 606, a last page programming date/time 607, a last programmed page 608, and the number of invalid pages 609.

The PBA group 601 denotes the first address (the first PBA) of the block 202 (refer to FIG. 2).

The chip number 602 shows the number of the memory chip 120 comprising the block 202. In this example, as shown in FIG. 6, a chip number 602 having a low address is associated in order starting from a PBA group 601 with a low address.

The block number 603 shows the number of the block. In this example, a block number 603 having a low address is associated in order starting from a PBA group 601 with a low address as shown in FIG. 6.

The number of erases 604 shows the number of times that erase processing has been carried out for the block identified in accordance with the block number 603. As used here, erase processing denotes erasing all the data that exists in a block 202, and re-erasing data inside a block 202 even when no data exists in the block 202. In this example, the number of erases 604 is incremented by 1 each time erase processing is carried out.

Previous erase date/time 605 denotes the date and time at which erase processing was recently carried out with respect to the block identified in accordance with the block number 603. In this example, when erase processing is carried out for a block, the date/time of this erase processing is registered as the previous erase date/time 605.

The first page programming date/time 606 denotes the date and time at which data was programmed to the first page of the block identified in accordance with the block number 603. As used here, "programming" denotes the writing of data to a block 202 (a page 301) from the register 201. In this example, when programming data to the first page, the date/time of this programming is registered as the first page programming date/time 606. Furthermore, a value denoting either "all pages erased" or "no write" is registered in the first page programming date/time 606 with respect to a block for which programming has not been carried out to the first page. Hereinafter, writing data from the host computer 10 to the FM module 100 will be called a "write", and writing data inside the FM module 100 will be called "programming".

The last page programming date/time 607 shows the date and time at which data was programmed to the last page of the block 202 identified in accordance with the block number 603. In this example, each time data is programmed to the last page, the date/time of this programming is registered as the last page programming date/time 607. Furthermore, a value denoting that writing to all the pages in the block is incomplete is registered as the last page programming date/time 607 with regard to a block 202 for which programming to the last page has not been carried out.

The last programmed page 608 shows the number of the page for which programming has been completed up to the current point in time in the block identified in accordance with the block number 603. In this example, the next programming-destination page 301 is specified by incrementing the value of this last programmed page 608 by 1. Furthermore, in a case where data has been programmed to all the pages 301 inside the block 202, the number of the last page is registered in the last programmed page 608. Furthermore, data cannot be programmed to this block 202 until erase processing has been performed.

The number of invalid pages 609 shows the number of invalid pages (pages not associated with a LBA 501) within the block 202 identified in accordance with the block number 603.

Since it is not possible to update the memory chip 120 using an overwrite, when the host computer 10 performs a data update with respect to an LBA 501, a new PBA 502 is associated with the LBA 501 (refer to FIG. 5). Then, data is programmed to the page 301 corresponding to this newly associated PBA 502. For this reason, a page 301 programmed with pre-update data becomes an invalid page, which loses its association with the LBA 501 and is not referenced from the host computer 10. In this example, the number of such invalid pages is managed for each block 202, and a block 202 that is targeted for reclamation, which will be explained further below, is selected based on the number of invalid pages.

The preceding has been an explanation of the block management table 600. Furthermore, in this example, the explanation gives an example in which all the information shown in FIG. 6 is used, but the block management table 600 does not necessarily have to be made using all the types of information shown in FIG. 6. Multiple control targets are possible in controlling the command interval of the memory chip 120, such as "time between programming and erase", "time between erase and programming", "time between erase and next erase" and "time between programming and next programming", but the block management table 600 may be made using only a portion of the information columns shown in FIG. 6. For example, in a case where the control target is the "time between programming and erase", the block management table 600 may be made using only the last page programming date/time 607. Furthermore, the size of the table 600 will increase, but information denoting the programming date/time for each page may be registered in the table 600. Then, the programming date/time for the PE interval or the EP interval does not necessarily have to be the programming date/time of either the first or the last page, but rather the date and time of programming of a page other than the first and last page may be used as the programming date/time for the PE interval or EP interval.

Furthermore, the various types of information of the block management table 600 (601 through 609) do not necessarily have to be recorded in the RAM 113. For example, the PBA group 601, the chip number 602, the block number 603, the number of erases 604, the previous erase date/time 605, the first page programming date/time 606, and the last page programming date/time 607 may be recorded with respect to the last page of the block 202 identified in accordance with the block number 603 included in this row for each row.

It is better that the period of time (PE interval) from the programming to the erasing of data with respect to a single block 202 (one page 301) be long. In this example, when the FM controller 110 attempts to erase data that has been programmed to a certain block 202, in a case where the time from the "last page programming date/time 607", which is the time at which data was programmed to the last page 301 of the pages 301 that configure this erase process-target block 202, to the current time has been detected and this time is equal to or longer than a certain threshold (hereinafter, the PE threshold), the data programmed to the erase process-target block 202 is erased. In so doing, it is possible to control the PE interval of all the pages 301 configuring the block 202 so as to be equal to or larger than the PE threshold. This is because the time period from the programming of data to the page 301 prior to the last page 301 until the present time will always be longer than that of the last page 301. That is, the PE interval of the last page 301 in the block 202 constitutes the shortest PE interval in this block 202, and the PE interval of the initial page 301 in this block 202 constitutes the longest PE interval in this block 202.

It is desirable to manage the programming date/time for each page 301 (or cell: a unit for configuring a page 301), but the management information will become voluminous. Rather than managing the programming date/time of all the pages configuring the block 202, managing the programming date/time for the last page and computing the PE interval based thereon as in this example makes it possible to control the PE intervals for all the pages configuring the block 202 to equal to or larger than the PE threshold while preventing the size of the management information 1140 from becoming voluminous.

Furthermore, it is better that the period of time (EP interval) from the erasing to the programming of data with respect to a page 301 be short. In this example, in a case where the period of time from the "previous erase date/time 605" of the block 202 to which data is attempting to be programmed (programming-target block) has been detected and this time is equal to or less than a certain threshold (hereinafter, the EP threshold), the data is programmed to the programming-target block 202. This makes it possible to control the EP interval to equal to or less than the EP threshold.

Furthermore, in a case where there is a block 202 for which the EP interval (the period of time from the "previous erase date/time 605" until the current time) exceeds the EP threshold, the FM controller 110 executes an erase process with respect to this block 202 even though data has not been programmed to this block 202. In accordance with this, since the "previous erase date/time 605" is updated to the current date/time, the EP interval is reset to the initial value (for example, zero).

FIG. 7 shows an example of a wear leveling management queue 700.

The wear leveling management queue 700 is one of the pieces of management information stored in the RAM 114. The wear leveling management queue 700 manages the number of erases of a block 202 (PBA group) by dividing the number of erases into levels of fixed number intervals. The wear leveling management queue 700 associatively manages a range of erases 701 and a PBA group 702.

The range of erases 701 shows ranges of the number of erases (at least one of the upper limit or lower limit of the number of erases). FIG. 7 shows an example of five levels based on the statistics (for example, the average values) of the number of erases of all the blocks 202 mounted in the FM module 100. That is, the range of erases will differs according to the average value of the number of erases of all the blocks 202 mounted in the FM module 100. The range of erases may be updated either regularly or irregularly.

In FIG. 7, for example, the level with the fewest number of erases (range of erases) is the range in which the number of erases equal to or larger than 201 is less than the average value, and thereafter, the number of erases is demarcated into a range of erases every 200 erases. In wear leveling, which equalizes the number of erases of a block, the equalization of the number of erases in realized by preferentially using blocks from a block group with a small number of erases (by preferentially using a block that belongs to the smallest level possible).

The PBA group 702 shows the first address of the block 202 that belongs to the range of erases 701.

The PBA group 702 is recorded as a FIFO (First In First Out) type queue, and a new PBA group 702 is registered at the end of the queue (the right end in the example of FIG. 7). Then, when using the blocks, the block, which was registered the earliest chronologically, is used, and the block registered at the end of the queue is not selected until all the previously registered blocks have been used.

Furthermore, in this example, an example in which the number of erases shown in FIG. 7 is divided into five levels, i.e., one level every 200 erases, was presented, but the present invention is not limited to these levels. For example, the number of erases can be sorted into various ranges in accordance with the precision of the equalization of number of erases that is required. Furthermore, the range of erases does not need to be uniform. For example, one range of erases can be 200 erases, and another range of erases can be 150.

The preceding has been an explanation of the management information used in this example.

Figure 8:
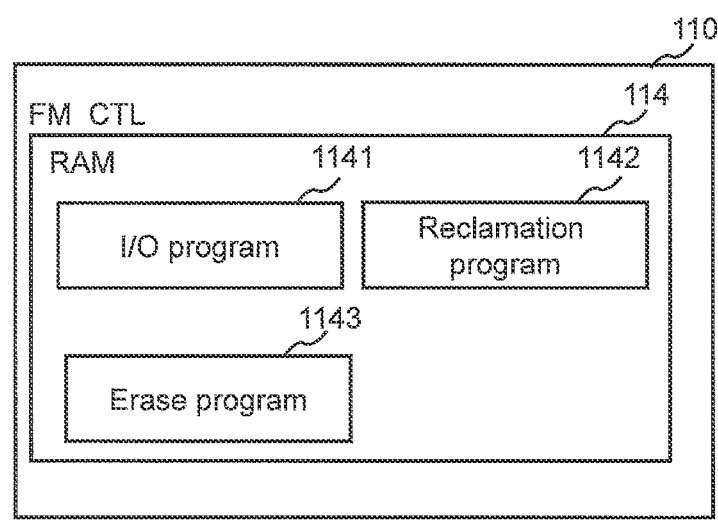
FIG. 8 shows an example of programs stored in RAM 114.

FIG. 8 shows an example of the programs stored in the RAM 114.

An I/O (Input/Output) program 1141, a reclamation program 1142, and an erase program 1143 are stored in the RAM 114. Various functions are realized in accordance with these programs being executed by the processor 115. These programs will be explained in detail further below using flowcharts.

Figure 9:
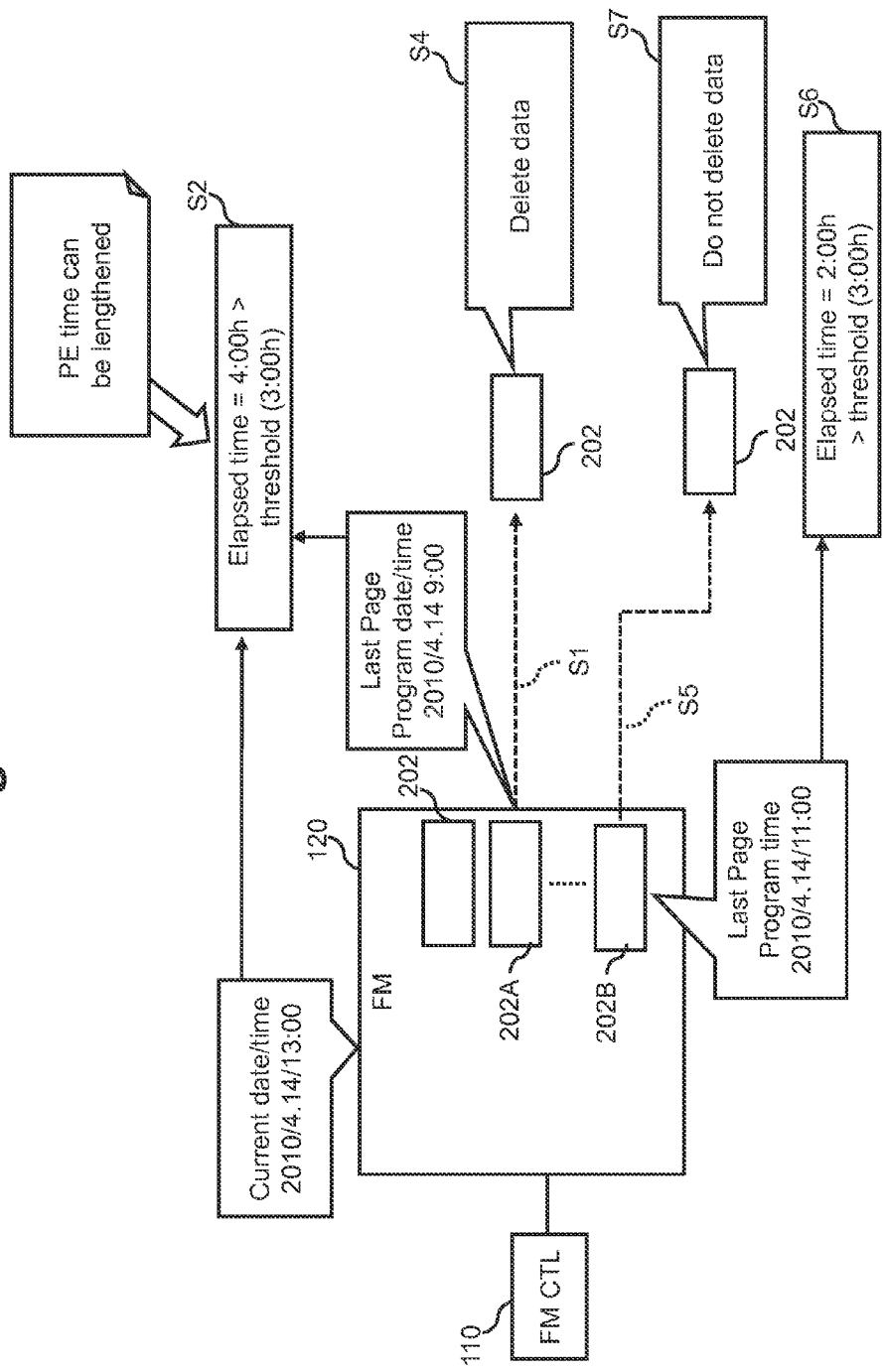
FIG. 9 shows an overview of erase process control.

FIG. 9 shows an overview of erase process control.

The FM controller 110 checks the "number of invalid pages 609" of the blocks 202 configuring each memory chip 120 mounted in the FM module 100, and detects a block for which the number of invalid pages 609 is greater than a reference value (Step S1). The reference value may be a prescribed threshold, or may be the average value of the number of invalid pages in all the blocks 202. That is, in S1, a block with an absolutely and/or relatively large number of invalid pages is detected. Here it is supposed that block 202A has been detected.

Next, the FM controller 110 computes the period of time from the "last page programming date/time 607" of the detected block 202A to the current time, and checks whether this computed time period (elapsed time) is equal to or larger than the PE threshold (S2). According to the example shown in the drawing, the PE threshold is 3 h (h: hours). The "last page programming date/time 607" of the block 202A is "2010/4.14/9:00". Since the current time is "2010/4.14/13: 00", the period of time until the present is 4 h. In this case, the FM controller 110 determines that the period of time since the block 202A was last programmed is equal to or larger than the PE threshold.

Therefore, the FM controller 110 executes an erase process with respect to the block 202A (S3).

Alternatively, even when block 202B is detected (S5), the FM controller 110 does not carry out an erase process for block 202B. That is, since the "last page programming date/time 607" for block 202B is "2010/4.14/11:00" and the current time is "2010/4.14/13:00", the period of time until the present is 2 h. This period of time (2 h) is not equal to or larger than the PE threshold (3 h). For this reason, the FM controller 110 does not carry out an erase process with respect to the block 202B (S6). In a case where the period of time from the "last page programming date/time 607" to the present is equal to or larger than the PE threshold with respect to the block 202B, the FM controller 110 will execute an erase process for the block 202B.

Thus, an erase process in not carried out for a block for which the period of time from the last page programming date/time 607 to the current time is not equal to or larger than the PE threshold. For this reason, the block PE interval is guaranteed to be the PE threshold.

Figure 10:
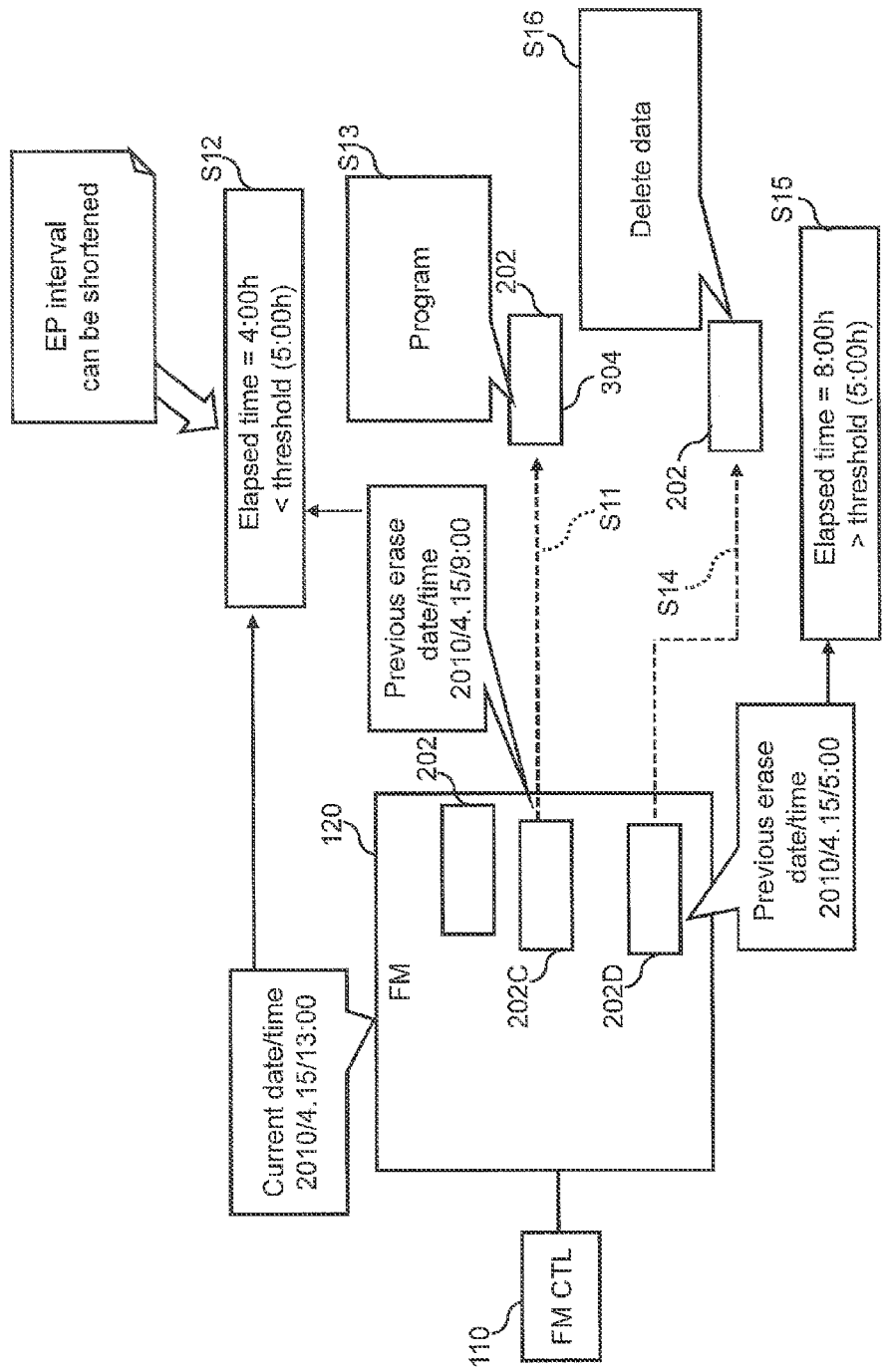
FIG. 10 shows an overview of programming process control.

FIG. 10 shows an overview of programming process control.

The FM controller 110 detects a post-erase process block (hereinafter, an erased block) 202C in which data is not written (S11). The FM controller 110 computes the period of time from the "previous erase date/time 605" of this block 202C to the current time, and checks whether or not the computed time period is equal to or less than the EP threshold (S12).

In the example shown in the drawing, the EP threshold is 5 h. The "previous erase date/time 605" of the block 202C is "2010/4.15/9:00". Since the current time is "2010/4.15/13: 00", the period of time up until the present (the elapsed time) is 4 h. In this case, the FM controller 110 determines that the period of time from the "previous erase date/time 605" of the block 202C is equal to or less than the EP threshold. In this case, the FM controller 110 programs data to the first page of the block 202C (S13).

Alternatively, even when the FM controller 110 detects the erased block 202D (S14), the FM controller 110 carries out an erase process with respect to the block 202D without programming data to the first page of the block 202D. Specifically, the "previous first page programming date/time 606" of the block 202D is "2010/4.15/5:00". Since the current time is "2010/4.15/13:00", the period of time up until the present is 8 h. In this case, the FM controller 110 determines that the period of time (8 h) from the "previous erase date/time 605" of the block 202D exceeds the EP threshold (S15). In this case, the FM controller 110 carries out an erase process with respect to the block 202D without programming data to the first page to the block 202D (S16).

Thus, data is not written to the first page of an erased block for which the period of time from the "previous erase date/time 605" exceeds the EP threshold. Consequently, the creation of a block for which the EP interval exceeds the EP threshold can be avoided.

The processing performed in this example will be explained in detail below.

Figure 11:
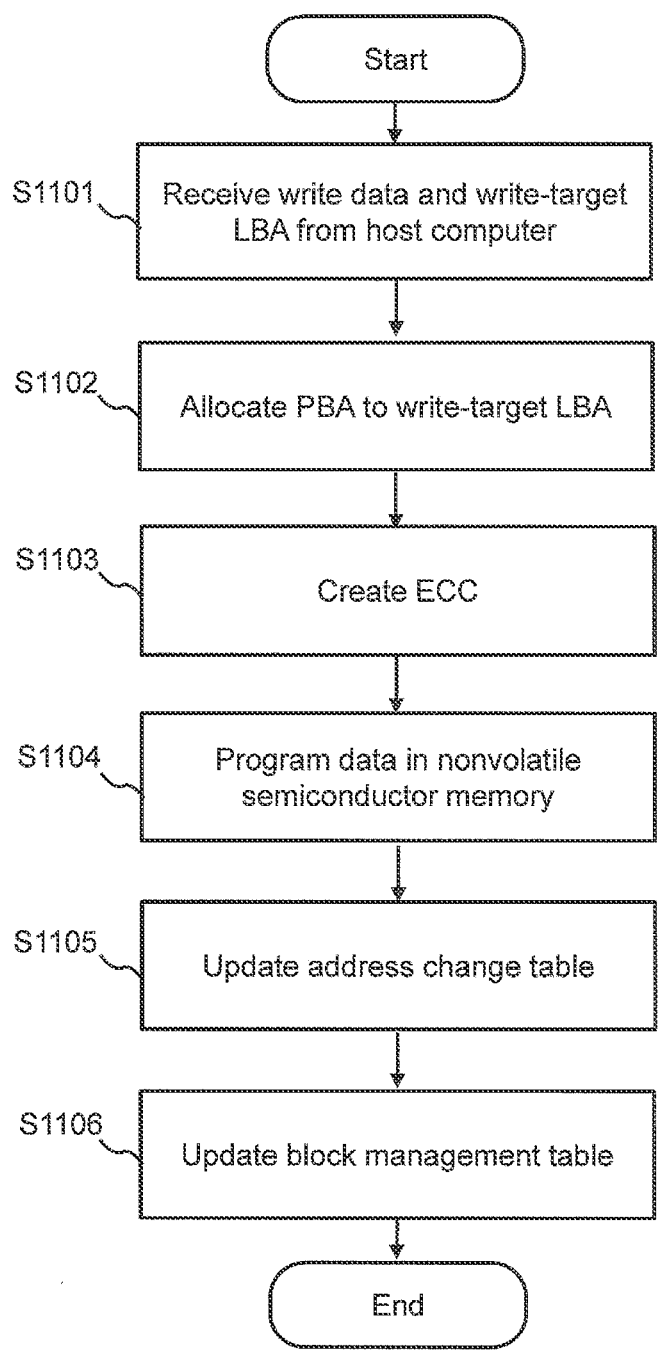
FIG. 11 shows an example of the flow of a programming process.

FIG. 11 shows an example of the flow of a programming process. The processor 115, for example, by executing the I/O program 1141, is able to carry out the processing explained by referring to FIG. 11.

The FM module 100 receives a write command, which includes write-target data and an LBA specifying a write-target area, from the host computer 10 (S1101). More specifically, the processor 115 is notified of a write command from the host computer 10 via the FE-IF 111. Next, the processor 115 instructs the FE-IF 111 to write the write-target data to the data buffer 113. The FE-IF 111 programs the write-target data from the host computer 10 to the data buffer 113.

Next, the processor 115 acquires the PBA associated with the LBA received in S1101 (S1102). This process is a characteristic process of this example, and as such will be explained in detail further below.

The processor 115 instructs the FM-IF 117 to create an ECC (Error Correcting Code) (S1103). Next, the FM-IF 117 reads the write-target data from the data buffer 113 in units of ECC-protected data lengths, computes an ECC for each protected data length using the ECC creation circuit inside the FM-IF 117, and programs this ECC and write-target data to the data buffer 113.

The processor 115 transfers the write-target data received in S1101 and the ECC created in Step S1103 from the data buffer 113 to the memory chip 120, and carries out programming (S1104). Specifically, the processor 115 instructs the FM-IF 116 to transfer the write-target data and the ECC created with respect thereto to the memory chip 120, and instructs the FM-IF 116 to carry out programming. Next, upon receiving the instructions, the FM-IF 116 reads the write-target data and the ECC from the data buffer 113, transfers this write-target data and ECC to the memory chip 120, and instructs the memory chip 120 to perform programming. The memory chip 120 programs the data in accordance with this instruction. The data programming destination is a page corresponding to the PBA identified in S1102.

In order to associate the LBA received in S1101 with the PBA acquired in S1102, the processor 115 updates the address conversion table (refer to FIG. 5) (S1105). By this processing, it becomes possible to acquire the PBA that is associated with the LBA from the host computer 10. Specifically, the processor 115 retrieves an LBA 501, which conforms to the LBA specified in the write data, from the address conversion table 500, and registers the PBA acquired in S1102 as the PBA 502 corresponding to the discovered LBA 501.

The processor 115 updates the block management table 600 (S1106). Specifically, the following operations are performed.

(S1106-1) The processor 115 searches the block management table 600 for the PBA group that conforms to the PBA acquired in S1102.

(S1106-2) Next, the processor 115 acquires the page number 301 of the page, which is in the block (the target block in the explanation of FIG. 11) of the PBA acquired in S1102, and which became the programming destination in S1104. The processor 115 registers this page number 301 as the last page programmed 608.

(S1106-3) Furthermore, when this page number 301 is the first page of the target block 202, the processor 115 registers information denoting the current time as the relevant first page programming date/time 606 of the block management table 600. When the page number 301 is the last page of the target block 202, the processor 115 registers information denoting the current time as the last page programming date/time 607.

The preceding has been an overview of the programming process.

Next, Step S1102, which is one of the characteristic features of this example, will be explained using FIG. 12.

When a long time has elapsed since an erase process was carried out, or when a long time has elapsed since data was programmed to a page, there is a risk that the initial threshold voltage for the page 301 will fluctuate, making it impossible to apply a suitable charge to the floating gate when programming and reducing the reliability of the stored data.

With respect to memory chip 120 characteristics like this, in this example, control is exercised to keep the elapsed time from the previous erase date/time and the elapsed time following programming a first page to within a fixed period of time.

Figure 12:
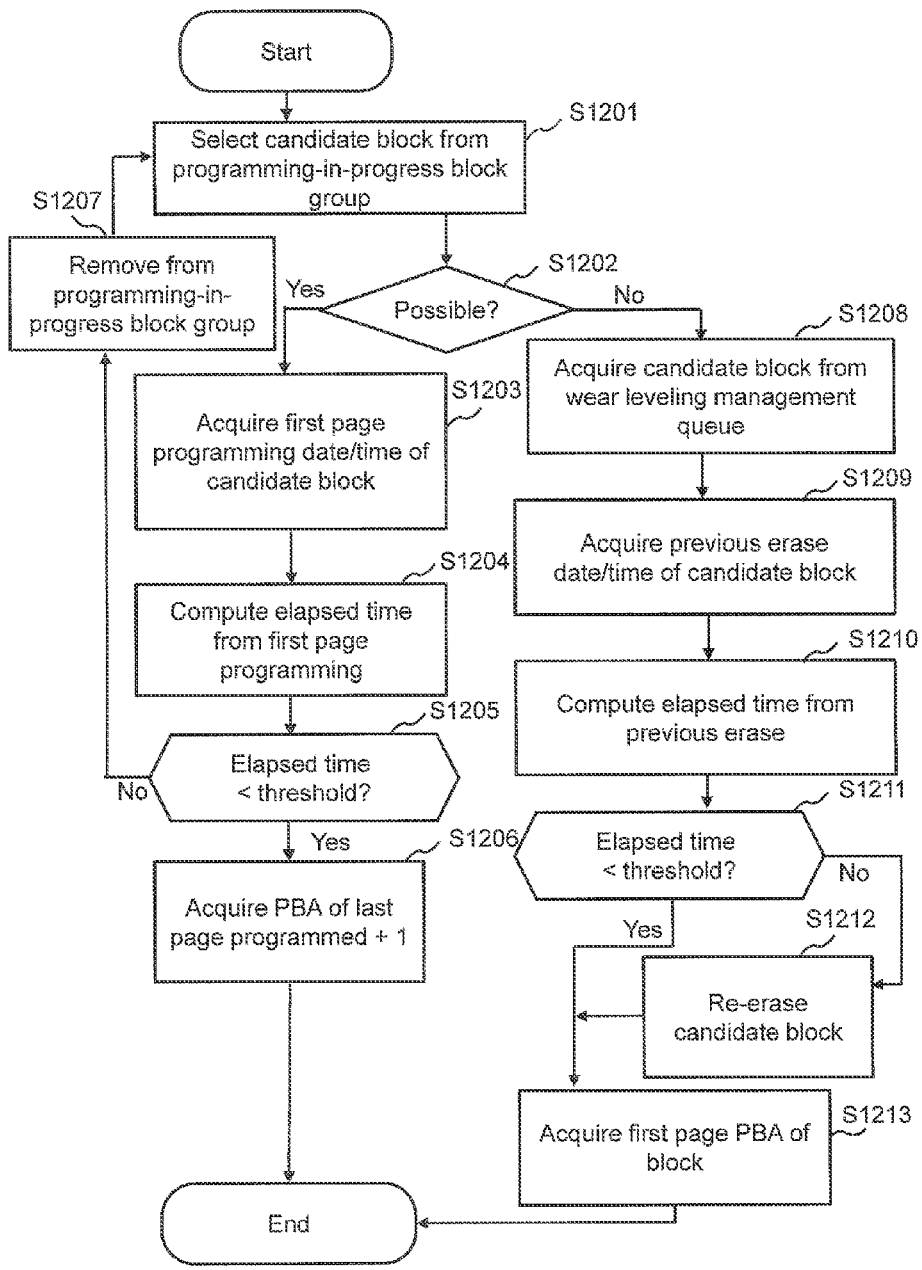
FIG. 12 shows an example of the flow of processing in Step S1102.

FIG. 12 shows an example of the flow of processing in Step S1102.

The processor 115 selects a candidate block from a group of blocks that have been partially programmed (S1201).

Specifically, the processor 115 refers to the block management table 600 and selects one arbitrary block from among multiple blocks 202 for which the last page programmed 608 does not denote the last page. As used here, a block 202 for which the last page programmed 608 does not denote the last page is the "partially programmed block" referred to in the explanation of FIG. 12, and the arbitrarily selected block is the "candidate block" referred to in the explanation of FIG. 12.

Furthermore, in S1201, the processor 115 may select a block for which the number of erases 604 is equal to or larger than a reference value (a prescribed threshold value, or a value obtained based on the number of erases of multiple blocks) as the partially programmed block that is able to become a candidate block. Since programming can be preferentially carried out to a block 202 with a small number of erases 604 in accordance with this, it is possible to lessen the drop in data retention reliability brought on by the passage of time subsequent to an erase.

The processor 115 determines whether or not it is possible to select a candidate block (S1202). In a case where a candidate block is acquirable (S1202: Yes), the processor 115 identifies the first page programming date/time 606 of the selected candidate block (S1203).

The processor 115 computes the elapsed time from the first page programming date/time 606 until the present (S1204).

The processor 115 determines whether or not the elapsed time computed in S1204 is equal to or less than a preconfigured threshold (hereinafter, the PP threshold) (S1205). In a case where the elapsed time is equal to or less than the PP threshold (S1205: Yes), the processor 115 identifies the PBA of the page subsequent to the last programmed page of the candidate block (S1206). This is because reliability is maintained in a case where the elapsed time computed in S1204 is equal to or less than the PP threshold.

In a case where the elapsed time computed in S1204 exceeds the PP threshold (S1205: No), the processor 115 removes the block selected in S1201 from the partially programmed block group (S1207). This is because of a risk that the drop in reliability will be outside an allowable range in a case where the elapsed time computed in S1204 exceeds the PP threshold. In S1207, specifically, for example, the processor 115 may register the value of the last page as the last page programmed 608 with respect to the block selected in S1201, and may register information denoting the current time as the last page programming date/time 607.

Alternatively, in a case where it is not possible to select a candidate block (typically, a case in which there are no partially programmed blocks) (S1202: No), the processor 115 refers to the wear leveling management queue 700 and selects a block with a number of erases that is less than the reference value (S1208). The memory chip 120, as was explained hereinabove, comprises characteristics whereby reliability decreases when the EP interval is long. For this reason, a control method, which carries out an erase immediately prior to programming is effective at enhancing reliability. However, in this example, based on the characteristic that the time it takes to erase the memory chip 120 is longer than the programming or read time, a block for which an erase process has been carried out is prepared beforehand for the purpose of enhancing the performance of the FM module 100. In this example, multiple erased blocks are divided into levels in accordance with the number of erases and registered in the wear leveling management queue 700. In S1208, for example, a block with the lowest possible range of erases level is selected.

The processor 115 identifies the "previous erase date/time 605" of the block selected in S1208.

The processor 115 computes the elapsed time from the previous erase date/time 605 identified in S1209 until the current time (S1210).

The processor 115 checks whether or not the elapsed time computed in S1210 is equal to or less than the EP threshold (S1211). In a case where the elapsed time computed in S1210 is equal to or less than the EP threshold (S1211: Yes), the processor 115 identifies the PBA of the first page of the block acquired in S1208 (S1213).

The processor 115, in a case where the elapsed time computed in S1210 is not equal to or less than the EP threshold (S1211: No), executes an erase process for the block selected in S1208 (S1212). According to this processing, the elapsed time from the previous erase date/time 605 until the current time is reset to the initial value (for example, zero). The processor 115 identifies the PBA of the first page of the block for which the erase process was executed in S1212 (S1213).

According to S1211 and S1212, the block comprising the page corresponding to the PBA identified in S1213 is guaranteed to be a block for which the elapsed time from the previous erase date/time 605 until to current time is equal to or less than the EP threshold.

In S1104 of FIG. 11, data is programmed to the page corresponding to the PBA identified in either S1206 or S1213.

The flow of a read process will be explained next.

Figure 13:
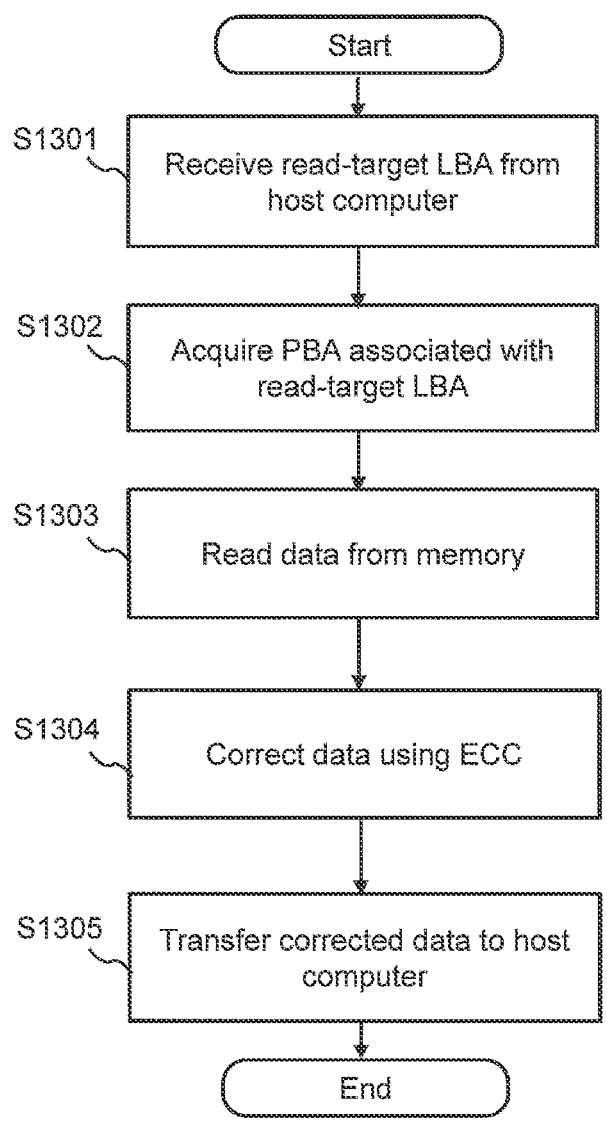
FIG. 13 shows an example of the flow of read processing.

FIG. 13 shows an example of the flow of read processing.

The FM controller 110 receives a read command specifying a LBA that will be the read target (the target LBA in the explanation of FIG. 13) from the host computer 10 (S1301).

The processor 115 refers to the address conversion table 500, and identifies the PBA allocated to the target LBA (S1302).

The processor 115 reads data from the page corresponding to the PBA identified in S1302 (S1303). Specifically, the processor 115 issues a read command to the FE-IF 116. Upon receiving the command, the FM-IF 116 specifies a block 202 and a page 301 to the memory chip 120 comprising the PBA-denoted page, and reads the data.

The FM-IF 116 uses the ECC appended to the data read in S1303 to check the integrity of the data that was read. When an error is detected in accordance with this check, the FM-IF 116 revises the data that was read using the ECC (S1304).

The FM-IF 116 transfers the read data to the host computer 10. In a case where the data was revised in S1304, the revised data is transferred to the host computer 10 (S1305).

The preceding has been an explanation of read processing in this example.

Next, a reclamation process of this example will be explained. In addition to a request from the host computer 10, the reclamation process also occurs collaterally in accordance with a write process.

First of all, the trigger for starting the reclamation process will be explained.

As was explained hereinabove, the memory chip 120 possesses characteristics whereby overwriting is not possible once data has been programmed to a page. For this reason, when writes are carried out with respect to the same LBA, data is programmed to the page subsequent to the last page programmed, and the PBA of the page to which data has been programmed anew is registered in the address conversion table 500 as the PBA corresponding to this LBA in place of the PBA of the page to which the pre-update data was programmed.

According to this control, a data update is carried out without the host computer 10 being made aware of the fact that the PBA has changed.

When the above-mentioned update write is carried out, the programmable pages inside the FM module 100 decrease due to a new page being used for each update write. For this reason, the FM module 100 of this example carries out a reclamation process in a case where the programmable pages inside the FM module 100 have become equal to or less than a fixed quantity.

The reclamation process, for example, is carried out by the processor 115 executing the reclamation program 1142. Specifically, the following operations are executed in the reclamation process.

(x1) The processor 115 searches for a block comprising invalid pages equal to or greater than a reference value. As used here, the "reference value" may be a prescribed threshold, or may be a value based on the number of invalid pages in multiple blocks (for example, an average value). That is, a block for which the number of invalid pages is either absolutely or relatively large is searched for here. The "invalid page" is a page for which a LBA has not been allocated in the address conversion table 500 and to which data has been programmed.

(x2) Next, the processor copies the data inside a valid page (a page allocated to an LBA in the address conversion table 500) included in the block discovered in (x1) to a page in another block, and updates the association with the LBA of the address conversion table 500 to the copy-destination page. According to this processing, all the pages inside the block discovered in (x1) are treated as invalid pages. That is, this block is treated as an invalid block. An invalid block is a block in which all the pages are invalid pages (in other words, a block, which does not include a valid page identified based on the PBA allocated to the LBA). The invalid block may be subjected to an erase process.

In the reclamation process of this example, multiple invalid blocks (blocks, which are erase-target candidates) may be managed, and an erase process with respect to the invalid block may be carried out in a case where the number of erased blocks is equal to or less than a threshold. Furthermore, this threshold may be decided in accordance with the write performance of the FM module 100.

Alternatively, according to memory chip 120 characteristics, when the PE interval (the elapsed time from programming to an erase) is short, the number of electron traps and positive hole traps created in the oxide insulation layer of a cell will be more numerous than when the PE time interval is long. For this reason, there is a risk that the reliability of a block with a short PE time interval will be low.

With respect to the above-mentioned characteristics, in this example, an erase process is not carried out for a block with a PE interval that is equal to or less than the PE threshold in erase processing triggered by a reclamation. As an exception, in a case where the number of erased blocks has been exhausted, an erase process may be performed with respect to a block for which the elapsed time from the last page programming date/time 607 is equal to or less than the PE threshold to secure an erased block. In so doing, the block, which undergoes the erase process, may be the block with the longest elapsed time from the last page programming date/time 607 from among multiple blocks for which the elapsed time from the last page programming date/time 607 is equal to or less than the PE threshold. Furthermore, the erase process, for example, may be carried out by the processor 115 executing the erase program 1143.

Figure 14:
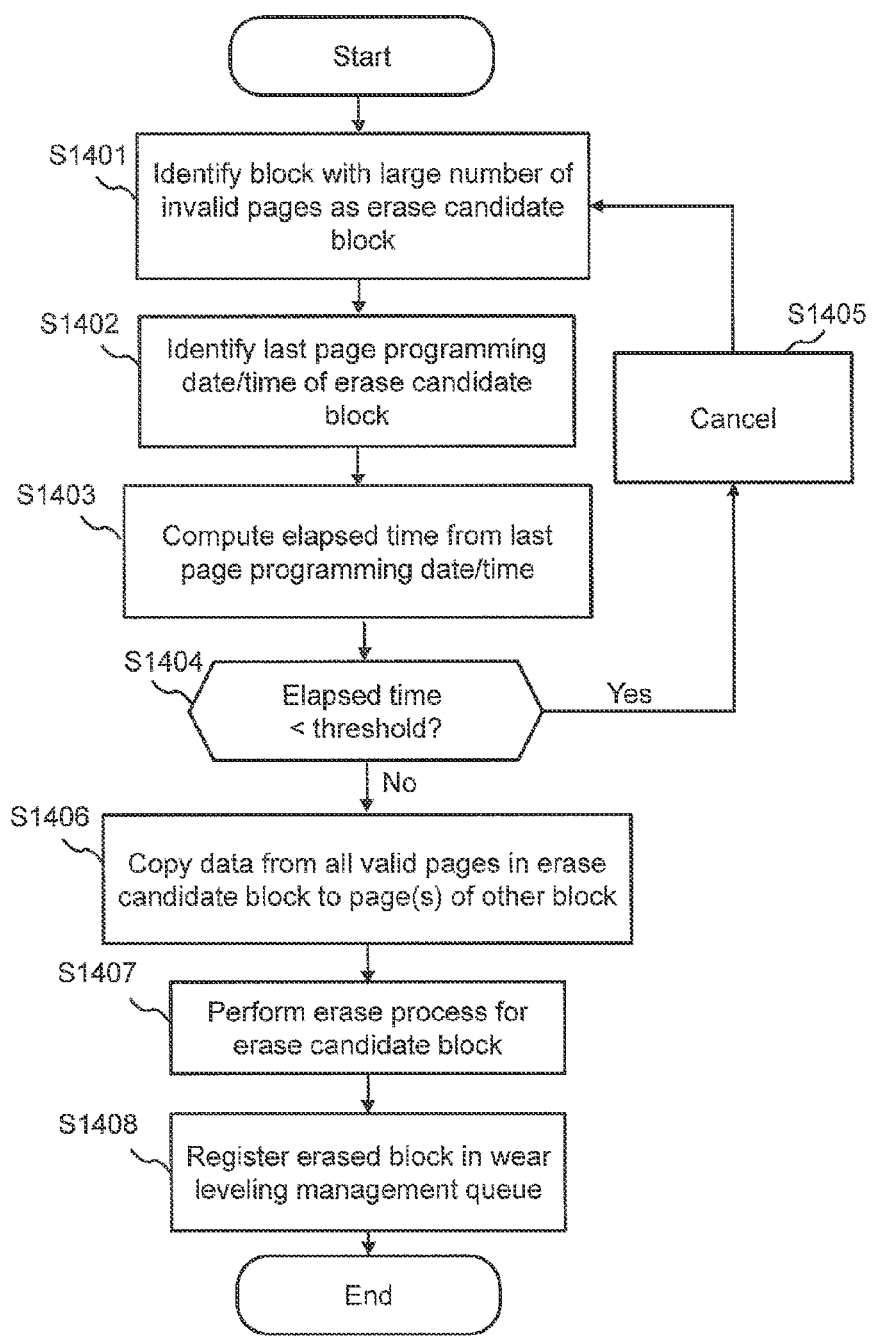
FIG. 14 shows an example of the flow of reclamation processing.

FIG. 14 shows an example of the flow of reclamation processing.

The reclamation process is started when a prescribed event has been detected, for example, when it has been detected that the number of erased blocks inside the FM module 100 is equal to or less than a prescribed threshold.

The processor 115 identifies from the block management table 600 a block for which the number of invalid pages 609 is either absolutely or relatively large (S1401). The block selected in S1401 may be a block in which data has been programmed to the last page.

The processor 115 identifies the last page programming date/time 607 of the block identified in S1401 (the "candidate block" in the explanation of FIG. 14) (S1402).

The processor 115 obtains the elapsed time from the last page programming date/time 607 for the candidate block by computing the difference between the value of the last page programming date/time 607 identified in S1402 and the current date/time (S1403).

The processor 115 checks whether or not the elapsed time computed in S1403 is less than the PE threshold (S1404). In a case where the elapsed time computed in S1403 is less than the PE threshold (S1404: Yes), the processor 115 cancels the candidate block (S1405), and carries out S1401 once again. In S1405, the processor 115 may write the number of the canceled candidate block to the RAM 114, for example, so that the canceled candidate block is not selected again. The reason why processing like S1405 is carried out is because there is a risk of data retention-related reliability dropping for the block for which the elapsed time obtained in S1403 is less than the PE threshold.

Alternatively, in a case where the elapsed time obtained in S1403 is equal to or larger than the PE threshold (S1404: No), the processor 115 copies the data of all the valid pages inside the candidate block to pages in another block (S1406). Then, the processor 115 associates the PBA of the copy-destination page with the LBA allocated to the PBA of the valid pages of the candidate block instead of the PBA thereof (an update of the address conversion table 500). According to this processing, all the pages inside the candidate block become invalid pages. That is, the candidate block becomes an invalid block. Furthermore, in a case where the candidate block acquired in S1401 was already an invalid block, this step does not have to be executed, and the processor 115 can execute the processing of S1407 subsequent to the processing of S1404.

The processor 115 carries out an erase process for the invalid block created in S1406 (S1407).

The processor 115 adds 1 to the number of erases of the block for which the erase process was carried out in S1406. Then, the processor 115 registers the erased block (candidate block) in the wear leveling management queue 700 based on the post-addition number of erases (S1408). In accordance with this, the candidate block is associated with the level of the range of erases to which the post-addition number of erases of the candidate block belongs.

The preceding has been an explanation of the reclamation process in this example. Furthermore, in this example, the elapsed time from the last page programming date/time 607 is compared to the PE threshold, but the elapsed time subjected to comparison is not limited thereto. For example, the elapsed time from the first page programming date/time 606 until the current time may be compared to the PE threshold. Furthermore, the last page programming date/time 607 does not have to be a measured value, and, for example, may be a value that was predicted from the first page programming date/time 606.

As has been described up to this point, in this example, an erase process is carried out with respect to a block for which the elapsed time from the last page programming date/time 607 is equal to or larger than the PE threshold, but an erase process is not carried out for a block for which this elapsed time is less than the PE threshold. Furthermore, data is programmed to the first page of a block for which the elapsed time from the previous erase date/time 605 is equal to or less than the EP threshold, but data is not programmed to the first page of a block for which this elapsed time exceeds the EP threshold (data is programmed to the first page of this block after an erase process has been carried out with respect to this block). Furthermore, in a case where the elapsed time from the first page programming date/time 606 is equal to or less than the PP threshold, data is programmed to the page subsequent to the last page that was programmed. In accordance with the above-described control, it is possible to hold a drop in the data retention-related reliability of the FM module 100 in check. Furthermore, since the fact that the PE interval will be equal to or larger than the PE threshold is assured, the point at which the number of erases reaches the upper limit can be delayed, thereby potentially extending the life of the FM module 100.

EXAMPLE 2

Example 2 will be explained below. In so doing, the explanation will focus on the points of difference with Example 1, and explanations of those points in common with Example 1 will either be simplified or omitted (Furthermore, the same will hold true for Example 3 as well.).

In Example 1, a minimum time period (PE threshold) is stipulated for the PE interval, but in Example 2, instead of stipulating a PE threshold, control is implemented so as to ensure a PE interval to the extent possible for individual blocks with respect to a command from the host computer 10.

FIG. 15 shows an example of a PE interval management queue 1500.

The PE interval management queue 1500 is one of the pieces of management information stored in the RAM 114. The PE interval management queue 1500 is management information, which is divided into groups in accordance with the elapsed time from the last page programming date/time until the current date/time (hereinafter, will be called the elapsed programming time), and in which each group is registered in a PBA group of invalid blocks corresponding to a range of elapsed times. The PE interval management queue 1500 is configured from an elapsed programming time 1501 and a PBA group 1502.

The elapsed programming time 1501 is information denoting the elapsed programming time.

According to the example of FIG. 15, the elapsed programming time is divided into four levels. The blocks are sorted into each of a number of fixed ranges of elapsed programming times such that the block group that belongs to the level with the longest elapsed programming time is the block group for which the elapsed programming time is 30 minutes or longer, followed by the block group for which the elapsed programming time is more than 20 minutes but less than 29 minutes. In this example, the elapsed programming time is managed on the order of minutes and is not managed on the order of seconds, but the unit of the elapsed programming time is not limited to minutes.

The PBA group 1502 stores the first address of a PBA group 1502 denoting a relevant block in each elapsed programming time level (range). The PBA group 1502 is registered as a FIFO type queue, and a new block is registered at the end of the queue.

In Example 2, an invalid block is managed using the PE interval management queue 1500. When the number of invalid blocks becomes equal to or less than a fixed number, an invalid block is created using an invalid block creation process (for example, the reclamation process), and the created invalid block is registered in the PE interval management queue 1500 based on the elapsed programming time of this invalid block. These operations will be explained in detail further below.

Furthermore, in Example 2, the PE interval management queue 1500 is updated either irregularly or regularly, for example, every 10 minutes. Specifically, each time the PE interval management queue 1500 is updated, the FM controller 110 measures the period of time from the time at which this queue 1500 was updated until the present. In a case where the elapsed programming time of the invalid block at a point in time T (the point in time at which 10 minutes has elapsed since the measured time) belongs to a higher level than the level to which this invalid block belonged at the point in time T, the FM controller 110 registers the PBA of the first page of this invalid block at the end of the queue of this higher level.

Furthermore, in this example, the queue 1500 changes every 10 minutes, but the updating of the queue 1500 is not limited to 10 minute intervals. For example, the queue 1500 may be updated in units of one second.

Next, the invalid block creation process in this example will be explained.

Figure 16:
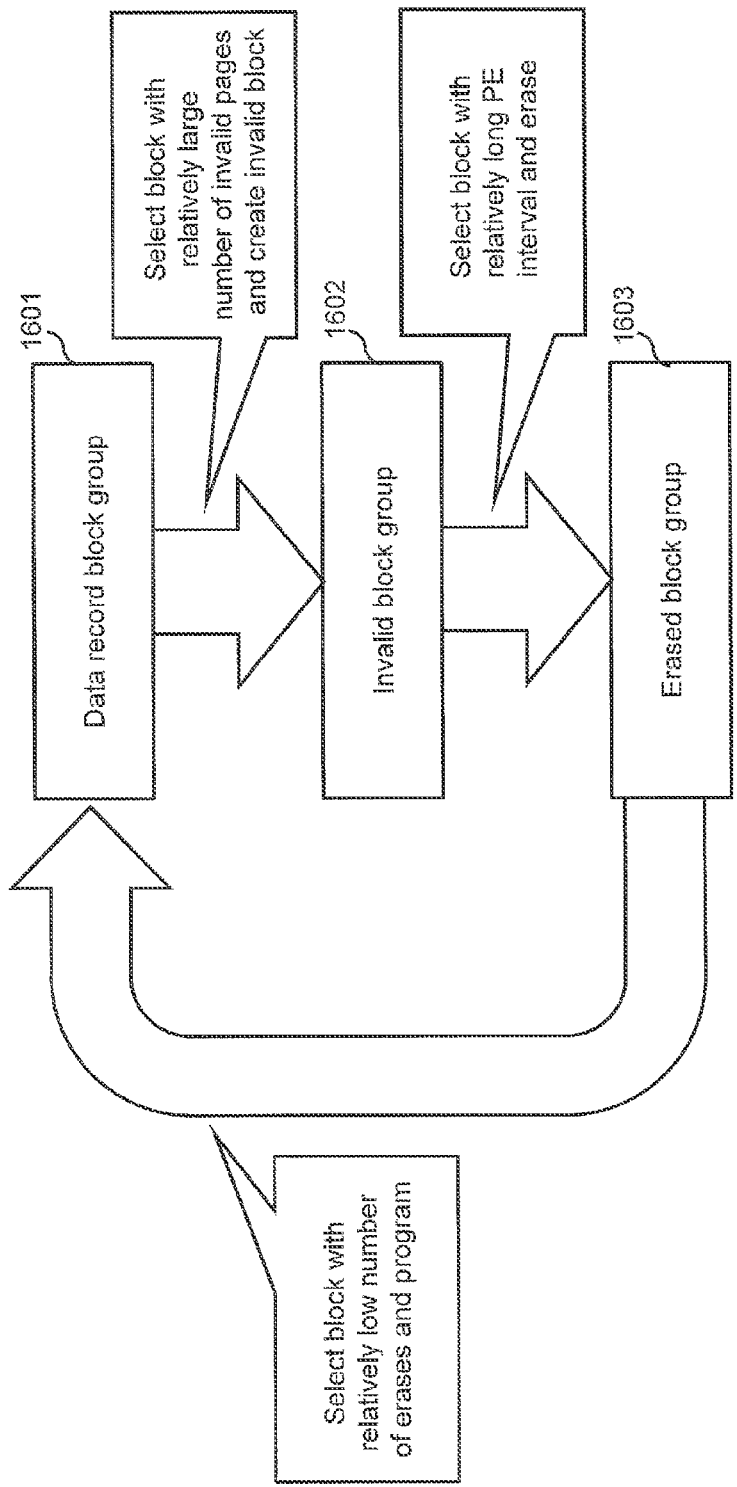
FIG. 16 is an outline diagram showing a block utilization cycle in Example 2.

FIG. 16 is an outline diagram showing a block utilization cycle in Example 2.

A data record block group 1601 is a block group conceptually showing blocks comprising valid pages. The FM controller 110 discerns the data record block group 1601 from the block management table 600. Furthermore, when the number of blocks registered in an invalid block group 1602 is equal to or larger than a fixed number, the FM controller 110 selects a block (that is, a block for which the invalid pages are either absolutely or relatively numerous) with a number of invalid pages that is equal to or larger than a reference value from among the data record block group 1601. This selected block is a reclamation candidate block. Then, the FM controller 110 copies all the valid pages of the reclamation candidate block to the pages of another block.

Next, the FM controller 110 changes the corresponding destination of the LBA to which the valid pages of the reclamation candidate block have corresponded, from the reclamation candidate block valid pages to the copy-destination pages thereof. In accordance with this, all the valid pages of the reclamation candidate block become invalid pages. As a result of this, the reclamation candidate block becomes an invalid block. An invalid block created in this way is registered in the invalid block group 1602.

The invalid block group 1602 is a block group in which invalid blocks (blocks in which all the pages are invalid pages) have been registered. The FM controller 110 registers the invalid block in the PE interval management queue 1500 level to which the elapsed programming time of this invalid block corresponds. When the number of blocks configuring the erased block group 1603 becomes equal to or less than a fixed number, the FM controller 110 selects from among the invalid block group 1602 a block for which the elapsed programming time is equal to or larger than a reference value, and creates an erased block by carrying out an erase process with respect to the selected invalid block. An erased block created in this way is registered in the erased block group 1603. Furthermore, the reference value of the elapsed programming time may be the prescribed PE threshold of the elapsed programming time, or may be a value (for example, an average value) based on the elapsed programming times of the multiple invalid blocks configuring the invalid block group 1602. That is, the selected invalid block is an invalid block with either an absolutely or relatively long elapsed programming time.

The erased block group 1603 is a block group in which erased blocks have been registered. The FM controller 110 registers an erased block in the wear leveling management queue 700.

The FM controller 110, when a write command is issued from the host computer 10 and partially programmed blocks (blocks with recordable pages in which data has not been recorded up to the last page) are equal to or less than a fixed number, selects from among the erased block group 1603 a block for which the number of erases is equal to or less than a reference value, and programs write data received from the host computer 10 to a page inside this selected block. In accordance with this, this block becomes a data record block (a partially programmed block). Furthermore, the reference value of the number of erases may be a prescribed threshold of the number of erases, or may be a value (for example, an average value) based on the number of erases of the multiple erased blocks configuring the erased block group 1603. That is, the selected erased block is an erased block with an either absolutely or relatively few number of erases.

The processing carried out by Example 2 will be explained in detail below.

Figure 17:
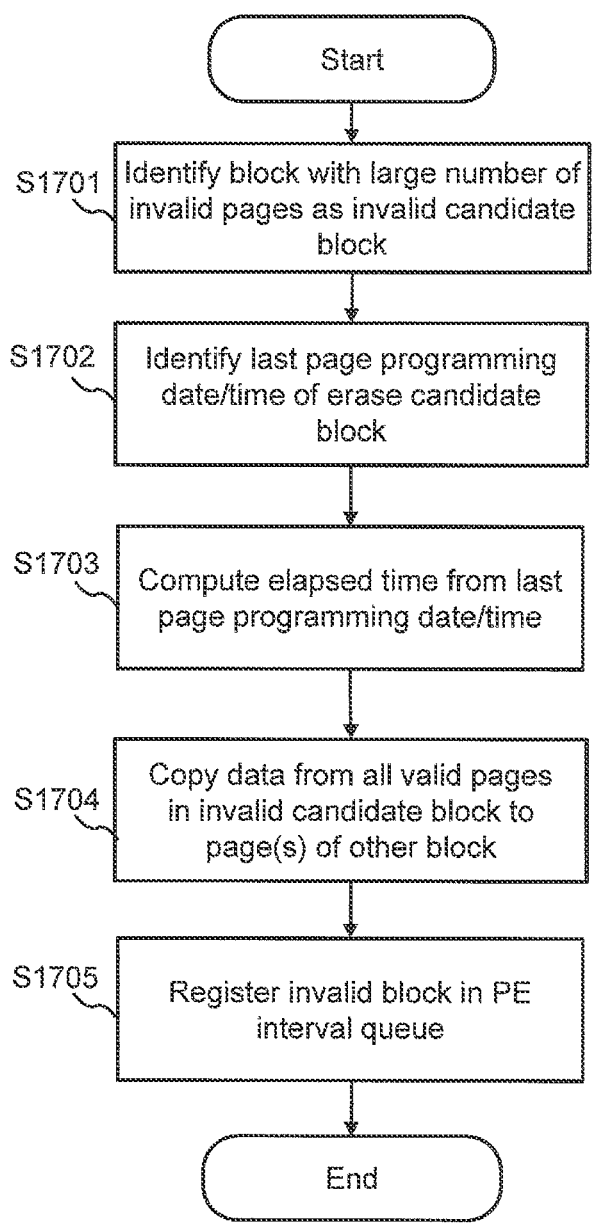
FIG. 17 shows an example of the flow of invalid block creation processing.

FIG. 17 shows an example of the flow of invalid block creation processing. The processor 115, for example, can carry out the processing explained using FIG. 17 by executing the invalid block creation program 1144 (refer to FIG. 19).

The processor 115 selects an invalid block candidate (an invalid candidate block) from the data record block group (S1701). Specifically, the processor 115 refers to the block management table 600 and selects a block with an either absolutely or relatively large value stored in the number of invalid pages 609 as the invalid candidate block. The processor 115 may select the block with the largest number of invalid pages from the table 600 as the invalid candidate block at this time. Furthermore, the criteria for the invalid block creation target is the threshold of the number of invalid pages, and the processor 115 may select as the invalid candidate block a block for which the value registered in the number of invalid pages 609 is equal to or larger than the threshold.

The processor 115 identifies the last page programming date/time 607 for the invalid candidate block selected in S1701 (S1702).

The processor 115 computes the elapsed time (elapsed programming time) from the last page programming date/time 607 identified in S1702 until the present (S1703).

The processor 115 copies all the valid pages inside the invalid candidate block selected in S1701 to free pages (pages in which data is not recorded, neither valid data nor invalid data) in another block, and changes the corresponding destination of the LBA with which a copy-source valid page is associated from the copy-source valid page to the copy-destination page thereof (S1704). In accordance with this processing, all the pages inside the invalid candidate block become invalid pages, and the invalid candidate block becomes an invalid block.

The processor 115 registers the invalid block (the candidate block in which all the pages became invalid pages) in the relevant level of the elapsed programming time computed in S1704 (S1705). For example, in a case where the elapsed programming time computed in S1703 is 12 minutes, the processor 115 records the PBA of the first page of the invalid candidate block in the row of the PE interval management queue 1500 for which the PE interval is from 10 minutes to 19 minutes.

The preceding has been an explanation of the invalid block creation process of this example.

Next, the erase process of this example will be explained.

Figure 18:
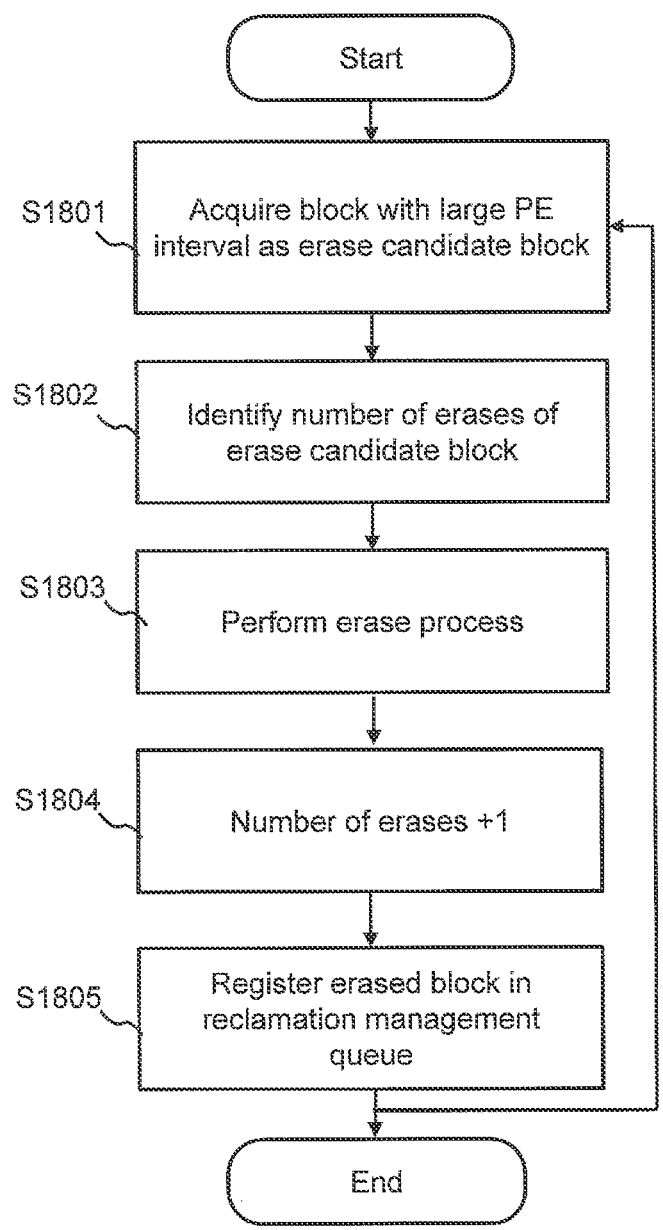
FIG. 18 shows an example of the flow of erase processing.

FIG. 18 shows an example of the flow of erase processing.

In the initial step of the erase process, the processor 115 refers to the PE interval management queue 1500, and selects a block from the level with the longest elapsed programming time (S1801). In the explanation of FIG. 18, the block selected in S1801 will be called the "erase candidate block".

More specifically, the processor 115 refers to the PE interval management queue 1500, and identifies the first block (the block, which was registered the furthest in the past of all the blocks registered in the group) of the longest elapsed programming time level (highest level) (30 minutes or more in the example of FIG. 15). In a case where a block is not registered in the highest level at this time, the processor 115 selects a block from the next highest level (from 20 minutes to 29 minutes in the example of FIG. 15). In a case like this where a block cannot be identified, the processor 115 drops down one level and selects a block from this level. Thus, the scope of the block search sequentially changes to a lower elapsed programming time level until a block can be acquired.

The processor 115 refers to the block management table 600 and identifies the value of the number of erases 604 for the row corresponding to the erase candidate block (S1802).

The processor 115 notifies the FM-IF 116 of the PBA denoting the erase candidate block and an erase command, and the FM-IF 116 notifies the chip comprising the erase candidate block of the block number, and sends this chip the erase command (S1803).

The processor 115 increments by 1 the number of erases identified in S1802 (S1804). In accordance with this, a new number of erases is decided for the erase candidate block.

The processor 115 uses the number of erases computed in S1804 to register the candidate block (erased block), which implemented the erase process in S1803, in the relevant level of the wear leveling management queue 700. The new number of erases is also registered in the number of erases 604 of the block management table 600 (S1805).

According to Example 2, an erase process is preferentially performed with respect to an invalid block with a long elapsed programming time. In accordance with this, the PE intervals of all the blocks can be made longer. As a result of this, the numbers of electron traps and positive hole traps generated when the PE interval is short are reduced, making possible higher reliability.

Furthermore, increasing reliability like this makes it possible to reduce blocks determined to be incapable of being used to store data, and to substantially increase the upper limit of the number of erases of usable blocks, thereby enabling the life of the FM module 100 to be prolonged.

Furthermore, the present invention may be put into practice by combining the minimum time rule of the PE interval in Example 1 and the control for ensuring the PE interval to the extent possible in this example (that is, Example 1 and Example 2).

EXAMPLE 3

Up to this point, examples for restricting the minimum time of the PE interval during normal processing (Example 1) or controlling the PE interval for a long time (Example 2) have been described. These examples make it possible to curb the generation of numerous electron traps and positive hole traps as a result of a shortened PE interval, and to prevent a drop in reliability related to the data retention of the nonvolatile semiconductor memory (data retention reliability).

Example 3 makes it possible to reduce the positive hole traps and electron traps that occur and to enhance data retention reliability by detecting a block having low data retention reliability and lengthening the PE interval for this block during operation. That is, this example makes it possible to reduce unusable blocks.

The data retention period in a nonvolatile semiconductor memory is generally limited. For this reason, it is preferable that processing be carried out to read and copy data to another location every fixed period. This processing is generally called a "refresh process". Furthermore, the number of failed bits in a nonvolatile semiconductor memory will increase together with the passage of time following data recording. For this reason, the FM controller 110, either regularly or irregularly, can read all the storage areas inside the FM module 100, and check the number of failed bits that have occurred on each page. This processing will be called a "verify process" in this example.

Figures 19, 20:
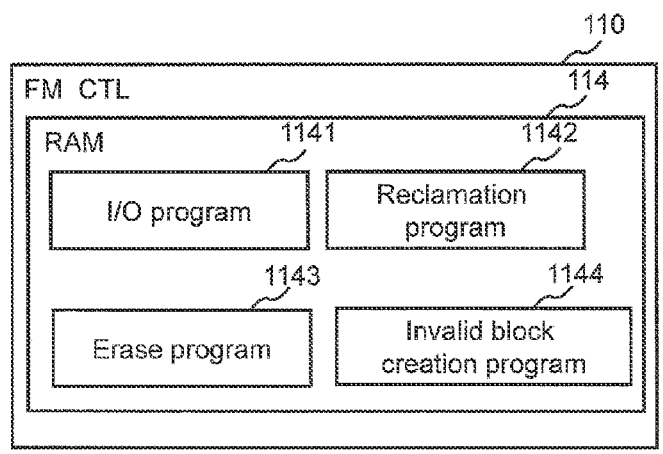
FIG. 19 shows an example of the programs stored in RAM 114.
FIG. 20 shows an example of a table showing the relationship between the number of elapsed days and a failed bit threshold.

FIG. 20 shows an example of a table showing the relationship between a number of elapsed days and a failed bit threshold.

When a number of days has passed since data was programmed, failed bits increase in the memory. For this reason, according to the table 2000 shown in FIG. 20, when the value of a number of elapsed days 2001 (for example, the number of days since programming data to a certain page (for example, either a first page or a last page) until the present) is high, a failed bit threshold 2002 is high. The failed bit threshold is the threshold of the number of failed bits.

In this example, in at least one of a read process (the processing of a read command from the host computer 10), a refresh process, or a verify process, the FM controller 110 identifies the failed bit threshold 2002 corresponding to the number of elapsed days (for example, the number of days since programming data to a certain page (for example, either a first page or a last page) until the present) with respect to a block. The FM controller 110 detects a block (hereinafter, will be called an at-risk block) for which the number of failed bits (or the average number of failed bits of all the ECC CWs inside the block) is equal to or larger than a failed bit threshold. More specifically, the FM controller 110 first reads data from a page inside the block during any of the above-mentioned processes. Then, the FM controller 110 acquires the number of failed bits for each ECC configuring this page. Next, the FM controller 110 identifies the block for which the number of failed bits is equal to or larger than the failed bit threshold as an at-risk block. Furthermore, the failed bit threshold may be a value of equal to or less than the number of bits capable of being corrected using the ECC.

A block, which has been determined to be an at-risk block, will become the target of the invalid block creation process described in Example 2. The FM controller 110 copies data of all the pages included in the at-risk block to another block, and updates the address conversion table 500. In accordance with this processing, an at-risk block becomes an invalid block. Then, the FM controller 110 registers this invalid block in an at-risk block management queue (not shown in the drawing). The at-risk block management queue is a FIFO type queue, and when registering a block in the queue, the block is registered at the end of the queue.

In Example 3, the invalid block is registered in the PE interval management queue 1500 the same as in Example 2.

Figure 21:
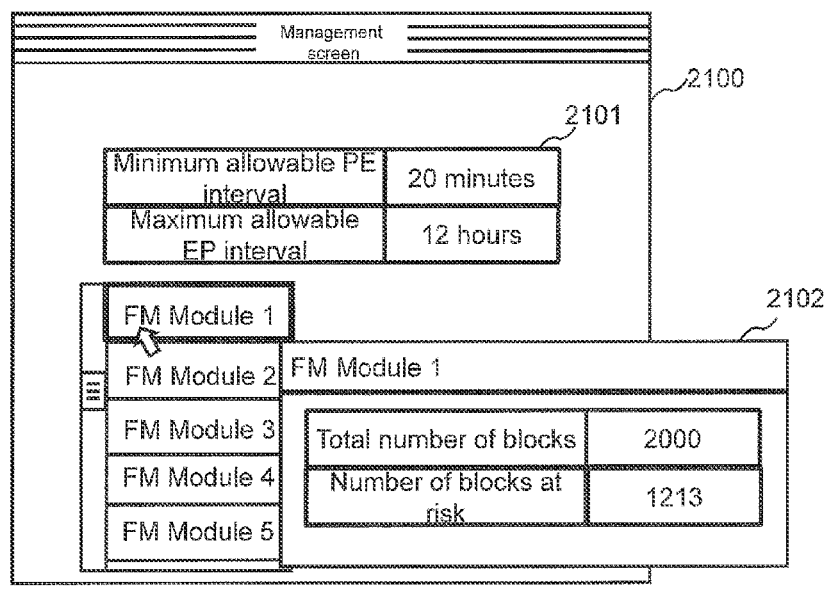
FIG. 21 shows an example of a management screen 2100.

FIG. 21 shows an example of a management screen 2100.

The management screen 2100 is a screen displayed on the management computer 11. The management computer 11 manages multiple (or one) FM modules 100.

The IDs (a list of modules) of multiple FM modules 100 managed by the management computer 11 are displayed in the management screen 2100. A user can select one or more FM module IDs from the list of modules.

The management screen 2100 comprises a time display area 2101, and a block display screen 2102 is displayed in front of this screen 2100. Information related to the FM module that was selected by the user from the multiple FM modules IDs is displayed in this screen 2102. The management computer 11 may collect management information from the multiple FM modules 100, and either a portion or all of this management information may be displayed in at least one of the screens 2100 and 2102.

A "minimum allowable PE interval" and a "maximum allowable EP interval" are displayed in the time display area 2101. This "minimum allowable PE interval" (that is, the PE threshold) and this "maximum allowable EP interval" (that is, the EP threshold) cannot be changed by the user via this management screen 2100 in this example, but the configuration may be such that at least one of these thresholds can be changed by the user via this screen 2100.

The block display screen 2102 displays a "total number of blocks" and a "number of blocks at risk" with respect to the FM module corresponding to the FM module ID selected by the user from the list of modules. The "total number of blocks" is the total number of blocks of the FM module 100 selected by the user, and the "number of blocks at risk" is the number of at-risk blocks from among these blocks. The at-risk block, as was described hereinabove, is a block for which the number of failed bits is equal to or larger than the failed bit threshold.

FIG. 22 shows an example of the flow of erase processing.

In this example, as was described hereinabove, a block with the number of failed bits that is equal to or larger than the failed bit threshold is managed as an at-risk block. The FM controller 110 as much as possible makes sure that an at-risk block does not become the target of an erase. This is because the memory chip 120 comprises characteristics whereby, when left alone in a state in which data has been programmed, the number of failed bits occurring in data recorded at the time of the next programming declines. The at-risk block is controlled so as to become an erase-target block after a prescribed period of time has passed with respect to the elapsed programming time of this block.

The processor 115 determines whether or not the number of selected blocks managed by the FM module 100 is less than a prescribed threshold (S2201). The threshold at this time, for example, is 100,000.

In a case where the number of selected blocks is less than the threshold (S2201: Yes), the same as in Example 2, the processor 115 selects an invalid block from the PE interval management queue 1500 (S2202). The processor 115 increments the number of selected blocks by 1. Therefore, the above-mentioned "number of selected blocks" denotes the number of times that an invalid block, which is not an at-risk block, has been selected. The processing from S2204 through S2207 is substantially the same as that of S1802 through S1805 (refer to FIG. 18) of Example 2, and as such, explanations will be omitted.

Alternatively, in a case where the number of selected blocks is equal to or larger than the prescribed threshold (S2201: No), the processor 115 acquires a block (the erase-target block in the explanation of FIG. 22) from the at-risk block management queue (S2208). The fact that the number of selected blocks rose from zero to equal to or larger than the threshold signifies that the at-risk block had been left alone and not selected for the period of time that it took the number of selected blocks to increase from zero up to equal to or larger than the threshold. Therefore, there is the likelihood that the number of failed bits occurring in data recorded at the time of the next programming to the at-risk block will decline. The at-risk block is preferably a block in which some sort of data has been programmed.

The processor 115 sets the number of selected blocks to the initial value (for example, 0) (S2209). In accordance with this, the at-risk block will not be selected as an erase candidate block until the number of selected blocks once again increases to equal to or larger than the threshold.

Subsequent to S2209, the processor 115 carries out the processing of S2204.

FIG. 23 shows an example of the flow of read processing.

The processing of S2301 through S2304 is substantially the same as that of S1301 through S1304 of FIG. 13, and as such, explanations will be omitted.

The processor 115 identifies the number of failed bits of the read-source block (S2305).

The processor 115 identifies the failed bit threshold corresponding to the number of elapsed programming days of the read-source block from the table 2000 shown in FIG. 20, and checks whether or not the number of failed bits identified in S2305 is less than the identified failed bit threshold (S2306).

In a case where the number of failed bits is less than the failed bit threshold (S2306: Yes), the processor 115 transfers corrected data to the host computer 10 (S1305).

Alternatively, in a case where the number of identified failed bits is equal to or larger than the failed bit threshold (S2306: No), the processor 115 registers the read-source block as an at-risk block (S2307).

According to Example 3, an at-risk block is selected as the erase candidate block less frequently than an invalid block that is not an at-risk block. In accordance with this, the PE interval of the at-risk block is extended. Extending the PE interval makes it possible detrap the electron traps and positive hole traps that exist inside the oxide layer of the at-risk block, to restore the data retention capabilities of the at-risk block, and to once again maintain data retention reliability. In accordance with this, unusable blocks decrease, the number of erases that can be used increases, and the life of the FM module 100 can be prolonged.

Furthermore, according to the above explanation, the at-risk block is a block with the number of failed bits that is equal to or larger than the failed bit threshold, but the comparison of the number of failed bits and the failed bit threshold may be carried out in prescribed units, such as, units of data, units of pages, or units of blocks.

Furthermore, either instead of or in addition to a block with the number of failed bits that is equal to or larger than the field bit threshold, the at-risk block may be a block that corresponds to at least one of (1) and (2) below.

(1) A programming time that is less than a first reference value.

(*) A hole can be formed in the oxide insulation layer when a block degrades. A risk is that although N electrons were intended to be put into the FG (floating gate), less than N electrons get into the FG and the remainder of the electrons enter the hole in the oxide insulation layer. In this case, the number of implanted electrons is less than N, causing the time required for programming to be shortened.

(*) The first reference value may be a prescribed threshold, or may be a value (for example, an average value) based on the programming time (the time required for programming) of multiple blocks. That is, this (1) may be an "either absolutely or relatively long programming time".

(2) A programming time that is less than a second reference value.

(*) When a block degrades, it is difficult to remove the electrons from the FG in an erase process.

(*) The second reference value may be a prescribed threshold, or may be a value (for example, an average value) based on the erase time (the time required for an erase process) of multiple blocks. That is, this (2) may be an "either absolutely or relatively short erase time".

A number of examples have been explained hereinabove, but the present invention is not limited to these examples.

For example, the LBA may be multi-tiered. For example, the LBA specified from the host computer 10 may be a first-tier LBA of an area in the logical volume, a second-tier LBA recognized by the FM module 100 may be associated with the first-tier LBA, and a PBA may be associated with the second-tier LBA. Even though the LBA is multi-tiered, the PBA is indirectly associated with the first-tier LBA.

Furthermore, for example, Example 3 includes Example 1 and Example 2, but Example 2 does not have to be included. In this case, for example, in S2202 of FIG. 22, a block with either absolutely or relatively numerous invalid pages may be selected, and in S2203, the number of selected blocks may be incremented by 1.

REFERENCE SIGNS LIST

100 FM module
110 FM controller
120 Memory (nonvolatile semiconductor memory)

What is claimed is:
1. A flash memory module comprising:
   a plurality of flash memory chips including a plurality of blocks, each of which is an unit of erasing data, and
   a flash controller, which is coupled to the plurality of flash memory chips, configured to program data to a block and erase data from a block, wherein
   the flash controller is configured to:
   manage, for each of the plurality of blocks, a recent programming time which is a time at which data is recently programmed to a block and
   erase data stored in a block for which an elapsed programming time, which is a time period from the recent programming time, is relatively long among the plurality of blocks.
2. The flash memory of claim 1, wherein each block comprises multiple pages, and is a type of block for which the erase process is carried in units of blocks and programming is carried out in units of pages, in relation to controlling a timing at which an erase process is carried out with respect to a block based on the recent programming time of the block, the recent programming time of the block is a time at which data is recently programmed to a last page of this block, and the target block is an invalid block that does not comprise a valid page, which is a page identified from a physical address allocated to a logical address.

3. The flash memory of claim 1, wherein the controller detects an at-risk block, wherein the at-risk block is a data-programmed block for which there is a risk that reliability drops, and in controlling a timing at which an erase process is carried out with respect to a block based on the recent programming time of this block, the controller preferentially selects an invalid block instead of the at-risk block from the multiple blocks as the target block.

4. The flash memory of claim 3, wherein, in controlling a timing at which an erase process is carried out with respect to a block based on the recent programming time of this block, the controller is configured to:

on a condition that a number of selected blocks is less than a second value, select an invalid block as the target block and update the number of selected blocks, wherein the number of selected blocks is the number of times that invalid blocks have been selected; and on a condition that the number of selected blocks is equal to or larger than the second value, select the at-risk block as the target block, and return the number of selected blocks to an initial value.

5. The flash memory of claim 4, wherein the at-risk block is a block for which the number of failed bits is equal to or larger than a failed bit threshold, and the controller identifies, from among multiple failed bit thresholds, a failed bit threshold corresponding to the elapsed programming time of the block, and in a case where the number of failed bits of this block is equal to or larger than this identified failed bit threshold, detects that this block is an at-risk block.

6. The flash memory of claim 5, wherein the elapsed programming time includes a first time period, which is a time period from the time at which data is recently programmed to the last page, and a second time period, which is a time period from the time at which data is recently programmed to a page other than the last page, and the elapsed programming time related to the controller detecting an at-risk block is the second time period.

7. A storage apparatus comprising:

a plurality of flash memory modules, each of the plurality of flash memory modules including a plurality of blocks, each of which is an unit of erasing data, and a flash controller, which is coupled to the plurality of flash memory chips, configured to program data to a block and erase data from a block, wherein the flash controller is configured to:

manage, for each of the plurality of blocks, a recent programming time which is a time at which data is recently programmed to a block and erase data stored in a block for which an elapsed programming time, which is a time period from the recent programming time, is relatively long among the plurality of blocks.

8. The storage apparatus of claim 7, wherein each block comprises multiple pages, and is a type of block for which the erase process is carried in units of blocks and programming is carried out in units of pages, in relation to controlling a timing at which an erase process is carried out with respect to a block based on the recent programming time of the block, the recent programming time of the block is a time at which data is recently programmed to a last page of this block, and the target block is an invalid block that does not comprise a valid page, which is a page identified from a physical address allocated to a logical address.

9. The storage apparatus of claim 7, wherein the controller detects an at-risk block, wherein the at-risk block is a data-programmed block for which there is a risk that reliability drops, and in controlling a timing at which an erase process is carried out with respect to a block based on the recent programming time of this block, the controller preferentially selects an invalid block instead of the at-risk block from the multiple blocks as the target block.

10. The storage apparatus of claim 9, wherein, in controlling a timing at which an erase process is carried out with respect to a block based on the recent programming time of this block, the controller is configured to:

on a condition that a number of selected blocks is less than a second value, select an invalid block as the target block and update the number of selected blocks, wherein the number of selected blocks is the number of times that invalid blocks have been selected; and on a condition that the number of selected blocks is equal to or larger than the second value, select the at-risk block as the target block, and return the number of selected blocks to an initial value.

11. The storage apparatus of claim 10, wherein the at-risk block is a block for which the number of failed bits is equal to or larger than a failed bit threshold, and the controller identifies, from among multiple failed bit thresholds, a failed bit threshold corresponding to the elapsed programming time of the block, and in a case where the number of failed bits of this block is equal to or larger than this identified failed bit threshold, detects that this block is an at-risk block.

12. The storage apparatus of claim 11, wherein the elapsed programming time includes a first time period, which is a time period from the time at which data is recently programmed to the last page, and a second time period, which is a time period from the time at which data is recently programmed to a page other than the last page, and the elapsed programming time related to the controller detecting an at-risk block is the second time period.

\* \* \* \* \*